United States Patent
Shiraishi

(10) Patent No.: US 6,483,571 B1
(45) Date of Patent: Nov. 19, 2002

(54) EXPOSURE APPARATUS AND METHOD FOR TRANSFERRING A PATTERN FROM A PLURALITY OF MASKS ONTO AT LEAST ONE SUBSTRATE

(75) Inventor: Kenichi Shiraishi, Okegawa (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/693,785

(22) Filed: Oct. 20, 2000

Related U.S. Application Data

(63) Continuation of application No. PCT/JP99/02124, filed on Apr. 21, 1999.

(30) Foreign Application Priority Data

Apr. 22, 1998 (JP) ............................................. 10-112428

(51) Int. Cl.[7] ........................ G03B 27/42; G03B 27/54; G03B 27/72; G01B 11/00
(52) U.S. Cl. ............................ 355/53; 355/67; 355/71; 356/399
(58) Field of Search ............................ 355/67, 53, 71; 356/399, 400, 401

(56) References Cited

U.S. PATENT DOCUMENTS

| | | | |
|---|---|---|---|
| 4,780,617 A | 10/1988 | Umatate et al. | 250/548 |
| 5,646,413 A | 7/1997 | Nishi | 250/548 |
| 5,912,727 A * | 6/1999 | Kawai | 355/67 |

FOREIGN PATENT DOCUMENTS

JP  06-333795  12/1994  ......... H01L/21/027

* cited by examiner

Primary Examiner—Russell Adams
Assistant Examiner—Peter B. Kim
(74) Attorney, Agent, or Firm—Synnestvedt & Lechner LLP

(57) ABSTRACT

An exposure apparatus and an exposure method that prevents a decrease in throughput, while maintaining high mask alignment accuracy regardless of frequent mask exchange. When a lot of wafers undergoes an exposure process, the patterns of two reticles are overlapped and exposed on a single shot area of a wafer. In this case, when each reticle is used for the first time, the positions of all alignment marks on the reticle are measured (fine position measurement). The reticle is positioned based on the measurement result. If the reticle is used again, only one set of the alignment marks is measured, the fine position measurement result is corrected based on the measurement result, and the reticle is positioned based on the corrected measurement value.

21 Claims, 15 Drawing Sheets

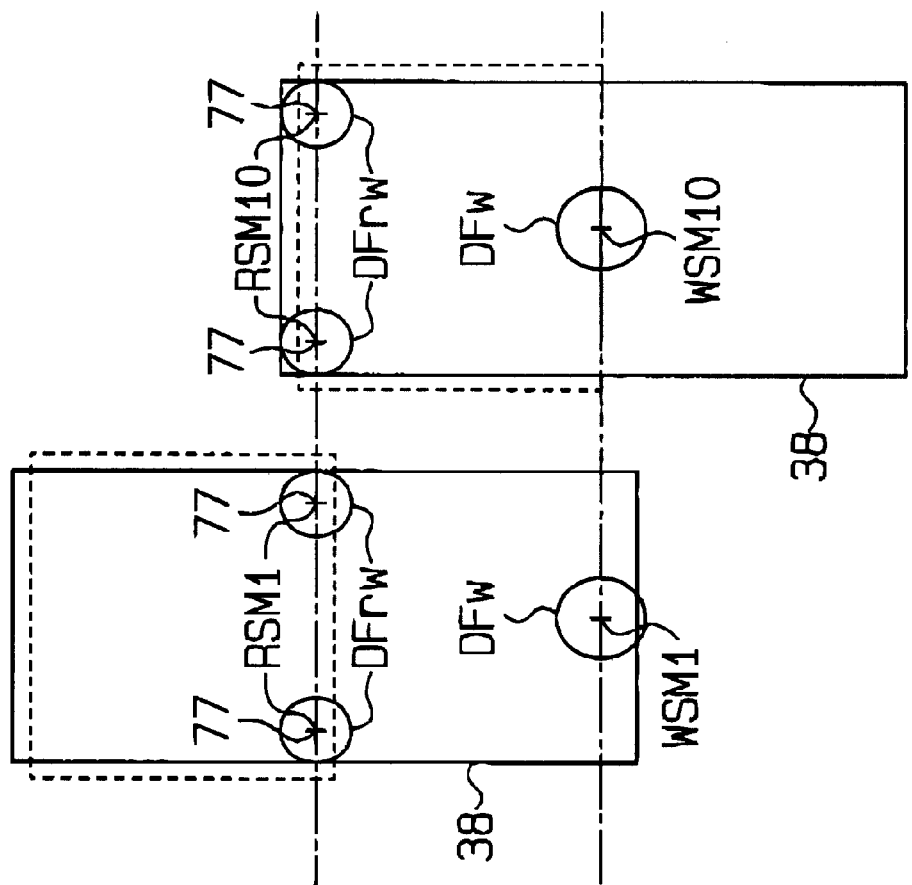

Initial position measurement process (fixed point reference)

Simple position measurement process (fixed point reference)

Initial position measurement process (partial update)

Simple position measurement process (partial update)

EXPOSURE APPARATUS AND METHOD FOR TRANSFERRING A PATTERN FROM A PLURALITY OF MASKS ONTO AT LEAST ONE SUBSTRATE

RELATED APPLICATION

This application is a continuation of PCT application number PCT/JP99/02124 filed on Apr. 21, 1999.

BACKGROUND OF THE INVENTION

The present invention relates to an exposure apparatus and an exposure method, and more particularly, to an exposure apparatus and an exposure method used in a lithography process for fabricating semiconductor integrated circuits, liquid crystal display device, thin film magnetic heads, or the like.

To fabricate devices, such as a semiconductor integrated circuit, a liquid crystal display device, and a thin film magnetic head, optical lithography is generally employed to form a circuit pattern on a substrate. During optical lithography, a exposure operation is performed, for example, in the following manner. A mask (original plate), on which a circuit pattern is formed, is arranged in an exposure apparatus and illuminated by an exposure light from a light source. The illuminated pattern is projected and the pattern of the mask is transferred onto the substrate, to which the photoresist has been applied, via an optical projection system.

A step and repeat (one-shot exposure) process is an example of such projection transcription. In the step and repeat process, shot areas, defined on the substrate, are moved in a stepped manner (stepping) and the circuit pattern is repeatedly exposed and transferred onto each of the shot areas. A step and scan (scanning exposure) process, in which the mask is moved together with the substrate while repeatedly exposing and transferring the circuit pattern onto the each of the shot areas, is also known.

An exposure apparatus, which projects and transfers a circuit pattern of a reticle onto a wafer, to fabricate a semiconductor integrated circuit will now be discussed.

In the exposure apparatus, the reticle and the wafer are arranged respectively on a reticle stage and a wafer stage. To properly project a pattern image from the reticle to the wafer or onto a circuit pattern already formed on the wafer, fine adjustments to the relative position and direction (rotation) of the reticle and the wafer must be made. In this case, the required position measurement, and subsequently performed position correction, or the required positioning, which includes both position measurement and position correction, are referred to as alignment.

The alignment includes reticle alignment and wafer alignment. The exposure apparatus has a reticle alignment sensor for measuring the position of a reticle alignment mark, which is formed together with the circuit pattern on the surface of the reticle. A wafer alignment sensor, which measures the position of a wafer alignment mark formed together with a circuit pattern on the surface of the wafer, is also provided. An alignment reference plate used to measure the relative position between the projected image of the reticle pattern and each of the shot areas on the wafer (including a base line amount of the wafer alignment sensor) is provided on the wafer stage. The reference plate has a reference mark that is used to perform position measurement with the two alignment sensors.

During reticle alignment, for example, the reticle alignment mark on the reticle surface is projected onto the reference plate, and the positional relationship between the reference mark and the reticle alignment mark is measured by a reticle alignment sensor. During wafer alignment, for example, the position of the reference mark and the position of the wafer alignment mark of at least three, for example, five to ten, shot areas, are measured using the wafer alignment sensor. The base line amount is then determined from the detection result of the reticle alignment sensor and the reference mark detection result of the wafer alignment sensor. Further, based on the wafer alignment detection result of the wafer alignment sensor, the position of each shot area on the wafer to which the reticle pattern is to be transferred is calculated as described in Japanese Unexamined Patent Publication No. 61-44429 and the corresponding U.S. Pat. No. 4,780,617. The information of the relative position between the reticle pattern projection image and each shot area obtained in this manner is used to move the reticle stage and the wafer stage so that the positions of the reticle and the wafer are matched in a two dimensional manner. When each wafer undergoes exposure for the first time, a circuit pattern and a wafer alignment mark are not yet formed on the wafer surface. Thus, the above wafer alignment is not performed. Further, when performing a TTR (Trough The Reticle) process, during which the wafer alignment sensor detects the reticle alignment mark and the wafer alignment mark, the detection of the reference mark, that is, the calculation of the base line amount is not necessary.

In a one shot exposure type exposure apparatus, at least one set of symmetrical reticle alignment marks are provided. In a scanning exposure type exposure apparatus, to reduce the influence of mark writing errors and compensate for mark measurement errors, multiple sets of the symmetrical marks are arranged and the positions of the multiple marks are measured.

Normally, an integrated circuit is formed from plural layers. The fabrication process includes the formation of a field oxide film, the dispersion of impurities, the formation of a gate oxide film, the formation of an insulating layer, and the formation of a wiring layer. The optical lithography process is repeatedly performed especially during the oxide layer formation process and the wiring layer formation process.

Since the pattern formed on the reticle differs for each process, the reticle must be changed when different processes are performed with the same exposure apparatus. After the reticle is changed and prior to exposure, reticle alignment must be performed to position the reticle at its predetermined position. Whenever exposure of the entire surface of a single wafer is completed, the wafer is exchanged with the next wafer, and prior to exposure, the new wafer must undergo wafer alignment to be positioned at its predetermined position.

Especially, during reticle alignment in the scanning exposure type exposure apparatus, the time for measuring the multiple sets of the reticle alignment marks is long. This results in a shortcoming in which the throughput of the exposure apparatus decreases significantly as the frequency of reticle exchanges increases.

Further, in recent years, to finely narrow the line widths of the circuit pattern in accordance with further integration of integrated circuits, for example, double exposure is performed to synthesize two types of patterns formed respectively on two reticles and form a pattern for a single layer of the wafer. Such double exposure inevitably increases the number of times the reticle is exchanged and further decreases the throughput of the exposure apparatus.

As described below, there are multiple types of double exposure.

(A) Exposure is performed by setting different optimal illumination conditions for a first reticle having, for example, an isolated line pattern, and for a second reticle having, for example, an L/S (line and space) pattern.

(B) Exposure is performed by arranging a first reticle and a second reticle, each having only an isolated line pattern, so that the isolated lines of the first reticle and the isolated lines of the second reticle are lined alternately to form an L/S pattern.

(C) A first reticle having an L/S pattern is first exposed, and then, a second reticle having a protection pattern and a thinning pattern is exposed. As a result, the L/S pattern corresponding to the protection pattern remains, and the L/S pattern corresponding to the thinning pattern is thinned thereby forming the isolated pattern.

(D) A first reticle having a phase shifter is first exposed, and then the residual areas at the peripheral portion of the phase shifter is exposed by a reticle and eliminated.

In types (A) and (B), the order of using the first and second reticles can be changed. However, in types (C) and (D), the second reticle must be exposed after the first reticle.

In this manner, during double exposure, the reticle must be exchanged at least once for every wafer and reticle alignment is necessary after exchanging the reticle. However, when a long time is required to exchange the reticle and perform reticle alignment, the throughput of the exposure apparatus decreases significantly. To solve this problem, the reticle exchange speed may be increased and the number of reticle alignment marks that are measured may be reduced. However, if the number of marks are simply reduced, the reticle position measurement accuracy and the mark writing error detection accuracy decreases. This results in another shortcoming and decreases the reticle alignment accuracy.

SUMMARY OF THE INVENTION

It is an object of the present invention to provide an exposure apparatus and an exposure method that prevents a decrease in throughput while achieving high mask alignment accuracy when performing an exposure process during which the mask is exchanged frequently.

A first aspect of the present invention provides an exposure apparatus for transferring a pattern formed on a plurality of masks onto at least one substrate. The masks are exchanged within a predetermined time period. The exposure apparatus includes a position sensor that measures relative position information of a plurality of reference marks arranged in correspondence with a plurality of measurement marks on the masks. A measurement controller is connected to the position sensor that controls the position sensor with a first position measurement mode that measures a plurality of first relative position information of the measurement marks and the reference marks and a second position measurement mode that measures second relative position information, the number of which is less than the first relative position information measured by the first position measurement mode. When the mask subsequent to an exchange matches the mask prior to the exchange during the predetermined time period, the second relative position information is measured by the second position measurement mode, the first relative position information associated with the mask subsequent to exchange is corrected using the second relative position information, and position information of the mask subsequent to the exchange is detected based on the corrected first relative position information.

In the first aspect, when the first relative position information of the plurality of reference marks and measurement marks is performed within a predetermined period, the second position measurement mode measures the second relative position information of some of the measurement marks and the reference marks. The first relative position information is corrected based on the second relative position information, and the position of the mask subsequent to exchange is detected based on the first relative position information.

In this manner, a first position measurement of a plurality of measurement marks and reference marks is performed when a mask exposes the first substrate of a lot. However, the number of measured marks may be decreased from the second exposure. This decreases the time required for mask alignment from the second exposure. In addition, the position of the mask subsequent to the exchange is detected by correcting the first relative position information using the second relative position information obtained through simple measurement that is performed from the second exposure. Accordingly, the mask alignment accuracy does not fall from the second exposure.

A second aspect of the present invention provides an exposure method for transferring a pattern formed on a plurality of masks onto a substrate. The masks are exchanged within a predetermined time period. The exposure method includes measuring first relative position information of a plurality of measurement marks arranged on the mask and a plurality of reference marks arranged in correspondence with the plurality of measurement marks. Then, the masks are exchanged for a plurality of times. Second relative position information of the measurement marks and the reference marks, the number of which is less than the first relative position information, is measured when the mask subsequent to an exchange matches one of the masks prior to the exchange during the predetermined time period. Next, the relative first position information related with the mask subsequent to the exchange is corrected using the second relative position information. The position of the mask subsequent to the exchange is then detected based on the corrected first relative position information.

The third aspect of the present invention provides an exposure method for transferring a pattern on at least one substrate in the same exposure apparatus using a plurality of masks that include a first mask and a second mask respectively having a first pattern and a second pattern. First, a plurality of marks formed on the first mask is detected to generate first position information. Next, the first pattern is transferred on a first substrate using the first position information, and the first mask is exchanged with the second mask. Then, the second pattern of the second mask is transferred to the first substrate or the different, second substrate. After exchanging the second mask with the first mask, some of the plurality of marks formed on the first mask is detected to generate second position information. The second position information and at least one piece of first position information are used to transfer the first pattern onto the first and second substrates and a different, third substrate.

In the third aspect, regardless of whether or not the substrate is exchanged, the first pattern of the first mask is transferred, the second pattern of the second mask is transferred, and then the first pattern is retransferred using at least one piece of the first position information and the second position information. Thus, during mask alignment when the first pattern is retransferred, the number of measured marks is decreased, and the time required for mask alignment is decreased.

In an exposure apparatus for a liquid crystal display device or the like, patterns of a plurality of masks are transferred in a continuous manner onto a plurality of shot areas of a substrate. A first pattern of a first mask may be transferred onto a first shot area, next, a second pattern of a second mask may be transferred onto a second shot area, and, then, the first pattern may be transferred again onto a third shot zone. In this case, the measurement marks for mask alignment during retranscription of a pattern on the same substrate is decreased. The time required for mask alignment is decreased not only during multiple exposure in which a plurality of circuit patterns is overlapped on a single shot area but also during exposure of a substrate for a liquid crystal display device in which a plurality of different circuit patterns are arranged along a plane.

A fourth aspect of the present invention provides an exposure method for transferring at least two patterns in an overlapped manner onto a plurality of substrates including a first substrate and a second substrate using a plurality of masks including a first mask and a second mask, which respectively have a first pattern and a second pattern. First, the first pattern of the first mask is transferred onto the first substrate, and the first mask is exchanged with the second mask. Next, the second pattern of the second mask is transferred onto the first substrate in a manner overlapping the first pattern, and the first substrate is exchanged with the second substrate. Then, the second pattern of the second mask is transferred onto the second substrate, and the second mask is exchanged with the first mask. Subsequently, the first pattern of the first mask is transferred onto the second substrate in a manner overlapping the second pattern.

In the fourth aspect, when the first substrate is exchanged with the second substrate, the second pattern is transferred onto the second substrate without exchanging the second mask. Then, the second mask is exchanged with the first mask, and the first pattern is transferred onto the second substrate in an overlapping manner. Thus, when performing multiple exposure on a plurality of substrates using a plurality of patterns, the number of times the mask is exchanged is decreased, and the number of mask alignment is decreased.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 8(a) is a plan view showing an optical projection system and a wafer alignment device, and FIG. 8(b) and FIG. 8(c) are plan views showing the reference mark plate during reticle alignment;

DETAILED DESCRIPTION OF THE PREFERRED EMBODIMENT

An embodiment of a step and scan type scanning exposure apparatus according to the present invention will now be described with reference to FIG. 1 to FIG. 17.

Figure 1:
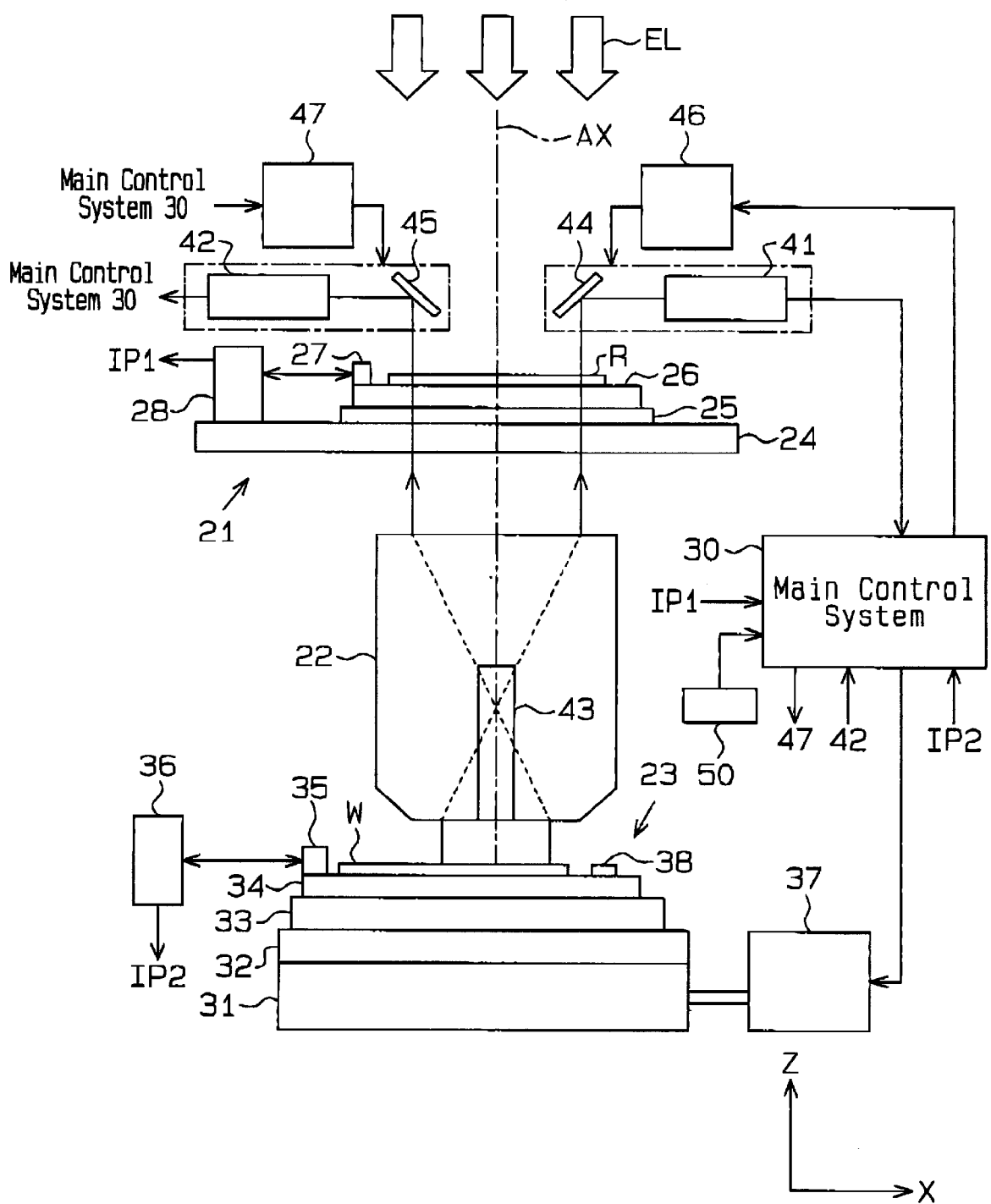
FIG. 1 is a schematic diagram showing an exposure apparatus according to a first embodiment of the present invention.

As shown in FIG. 1, in the exposure apparatus of this embodiment, a circuit pattern of a reticle R, which is held on a reticle stage 21 and serves as a mask, is illuminated in a rectangular illumination area (hereafter referred to as slit-like illumination area) of an exposure light EL (e.g., KrF excimer laser light, an ArF excimer laser light, an $F_2$ laser light, and an $Ar_2$ laser light) of an optical illumination system, which is not shown. The image of the pattern is reduced by a magnification of 1/M by an optical projection system 22. Then, the pattern image is projected and exposed on a wafer W, which is held on a wafer stage 23 and serves as a substrate. In this state, in the slit-like illumination area of the exposure light EL, the reticle R is scanned at a fixed velocity V in a forward direction relative to the plane of FIG. 1, and the wafer W is scanned at a fixed velocity V/M in a backward direction relative to the plane of FIG. 1 synchronously with the scanning of the reticle R.

Figure 2A:
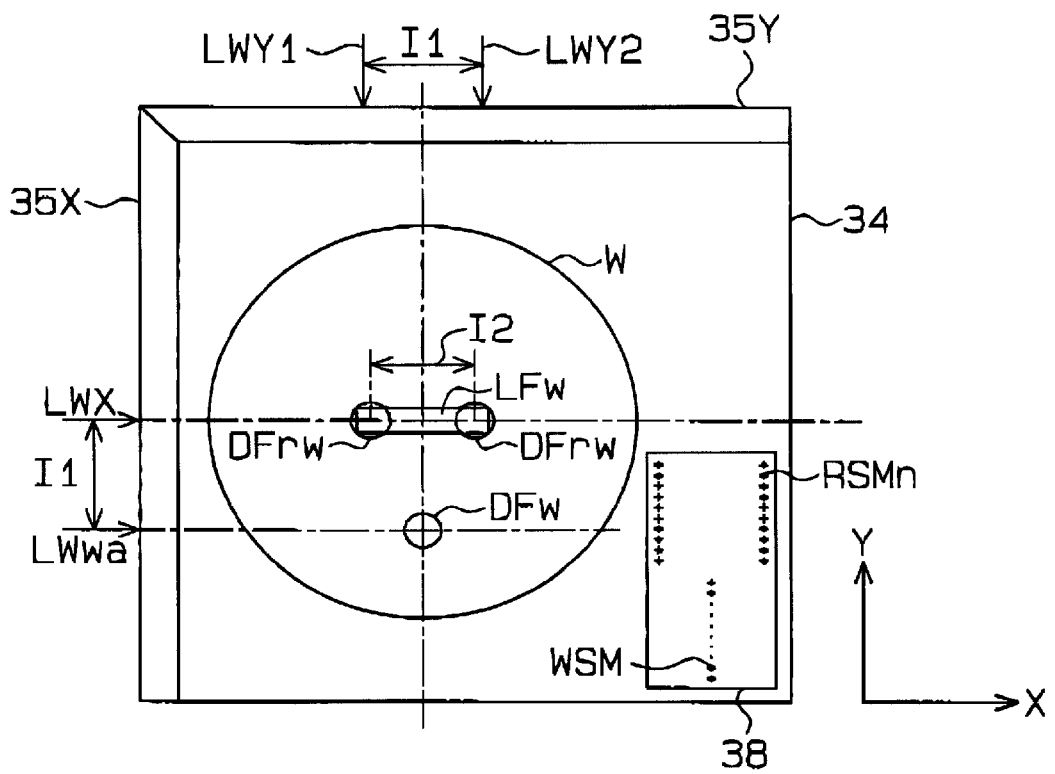
FIG. 2(a) is a plan view showing a Zθ axis drive stage of a wafer stage of the exposure apparatus of FIG. 1.
Figure 2B:
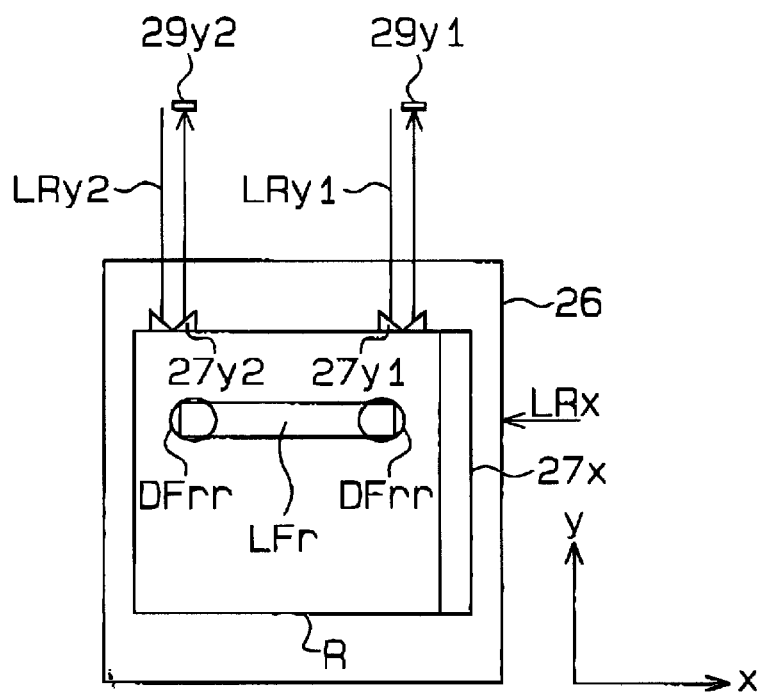
FIG. 2(b) is a plan view showing a reticle fine drive steps.

As shown in FIG. 1 and FIG. 2(b), a reticle Y axis drive stage 25, which is movable in a Y axis direction (the direction perpendicular to the plane of FIG. 1), is arranged on a reticle support 24 of the reticle stage 21. A reticle fine drive stage 26 is arranged on the reticle Y axis drive stage 25. The reticle R is held on the reticle fine drive stage 26 by a holding device (not shown), such as a vacuum chuck.

On a plane perpendicular to an optical axis AX of the optical projection system 22, the reticle fine drive stage 26 is used for fine control of the position of the reticle R with high accuracy in an X axis direction, which is parallel to the plane of FIG. 1, the Y axis direction, and a rotating direction (θ direction). An X axis movable mirror 27x and two Y axis movable mirrors 27y1, 27y2 are formed on the reticle fine drive stage 26. A laser beam LRx parallel to the X axis is irradiated against the X axis movable mirror 27x, and laser beams LRy1, LRy2 parallel to the Y axis are irradiated against the movable mirrors 27y1, 27y2.

The average value (y1+y2)/2 of coordinate values y1, y2, which are measured by two interferometers 28 employing the laser beam LRy1, LRy2, is used as the Y axis coordinate of the reticle fine drive stage 26. Further, a coordinate value that is measured by an interferometer 28 employing the laser beam LRx is used as the X axis coordinate. A rotating amount in the rotating direction (θ direction) of the reticle fine drive stage 26 is obtained, for example, from the difference between the coordinate values y1 and y2.

Corner-cube type reflective elements are preferably used as the Y axis movable mirrors 27y1, 27y2. The laser beams LRy1, LRy2 reflected by the movable mirrors 27y1, 27y2 are reflected and returned by reflective mirrors 29y1, 29y2, respectively. That is, the reticle interferometers 28 are double pass interferometers, and the reticle fine drive stage 26 is rotated based on the measurement results of the double pass interferometers to prevent the position of the laser beam from being offset. In this manner, the interferometers 28 constantly monitor the X axis direction, Y axis direction, and θ direction positions, and the obtained position information IP1 is provided to a main control system 30.

As shown in FIGS. 1 and 2(a), a wafer Y axis drive stage 32, which is movable in the Y axis direction, is arranged on a wafer support 31 of a wafer stage 23. A wafer X axis drive stage 33, which is drivable in the X axis direction, is arranged on the wafer Y axis drive state 32. A Zθ axis drive stage 34 is arranged on the wafer X axis drive stage 33, and the wafer W is secured to the Zθ axis drive stage 34 by means of vacuum suction.

The wafer Y axis drive stage 32 moves synchronously with the reticle Y axis drive stage 25 at a relative velocity corresponding to the magnification of the optical projection system 22. This enables synchronous scanning of the wafer W and the reticle R.

The Zθ axis drive stage 34 is finely rotatable along a XY plane perpendicular to the optical axis AX of the optical projection system 22. Further, the Zθ axis drive stage 34 is finely moved in the Z axis direction, which is parallel to the optical axis AX, and inclined in a two dimensional manner relative to an XY plane (i.e., the image surface of the optical projection system 22) by, for example, three actuators.

An X axis movable mirror 35X and a Y axis movable mirror 35Y are fixed to the Zθ axis drive stage 34. Two laser beams LWX and LWwa, which are spaced by a gap I1, are irradiated against the X axis movable mirror 35X along an optical path parallel to the X axis. The optical path extends through the optical axis AX of the optical projection system 22 and a reference point of a wafer alignment apparatus 43, which will be described later. Two laser beams LWY1 and LWY2, which are spaced by a gap I1, are irradiated against the Y axis movable mirror 35Y along an optical path parallel to the Y axis. The coordinate value measured by an interferometer 36 employing the laser beam LWX is used as the X coordinate of the Zθ axis drive stage 34 during exposure. The average value (Y1+Y2)/2 of coordinate values Y1, Y2, which are measured by the interferometer 36 using the laser beam LWY1 and LWY2, is used as the Y axis coordinate. Further, a rotating amount (yawing amount) in the rotating direction (θ direction) of the Zθ axis drive stage 34 is obtained, for example, from the difference between the coordinate values Y1 and Y2. In this manner, the position of the Zθ axis drive stage 34 in the X axis direction, the Y axis direction, and the θ direction is constantly monitored, and the obtained position information IP2 is provided to the main control system 30. Another laser beam (not shown) is irradiated against each of the movable mirrors 35X, 35Y to detect the inclination amount of the Zθ axis drive stage 34, that is, the rotating amount about the X axis (pitching amount) and the rotating amount about the Y axis (rolling amount).

The main control system 30 controls the positions of the wafer Y axis drive stage 32, the wafer X axis drive stage 33, and the Zθ drive stage 34 via a wafer drive device 37 and controls the operation of the entire apparatus.

A reference mark plate 38 is fixed to the Zθ axis drive stage 34 near the wafer W. The reference mark plate 38 is used to correlate the wafer coordinate system (X, Y), which is measured by the wafer interferometer 36, with the reticle coordinate system (x, y), which is measured by the reticle interferometers 28. Various reference marks, which will be described later, are formed on the reference mark plate 38.

Reticle alignment microscopes (hereafter referred to as "RA microscopes") 41, 42 are arranged above the reticle R. The RA microscopes 41, 42 simultaneously observe a reticle alignment reference mark (hereafter referred to as "RA reference mark") on the reference mark plate 38 and a reticle R measuring mark (hereafter referred to as "reticle mark") on the reticle R. A wafer alignment device (hereafter referred to as "WA device") 43 is arranged beside the optical projection system 22 in the Y axis direction. The WA device 43 is preferably an off-axis device and observes the alignment mark on the wafer W (hereafter referred to as "wafer mark").

Referring to FIG. 2(b), slit-like illumination area LFr and observation areas DFrr, which are located at both ends of the slit-like illumination area LFr in correspondence with the RA microscopes 41, 42, are defined on the reticle R. As shown in FIG. 2(a), slit-like illumination are LFw, which corresponds to the illumination area LFr, and observation areas DFrw, which are conjugated with the observation areas DFrr, are defined on the surface of the wafer stage 23 where the wafer W is held. Deflection mirrors 44, 45 are movably arranged near the RA microscopes 41, 42, respectively, to guide detection light from the reticle R to the RA microscopes 41, 42. When the exposure sequence is initiated, in response to a command from the main control system 30, the deflection mirrors 44, 45 are moved away from the optical path of the exposure light EL by mirror drive devices 46, 47, respectively.

A keyboard 50 is connected to the main control system 30. An operator uses the keyboard 50 to input various operation conditions that are provided to the main control system 30. The operator also uses the keyboard 50 to input various reticle alignment modes provided to the main control system 30. Various commands may be sent to the main control system 30 through, for example, a network such as the internet.

Figure 3:
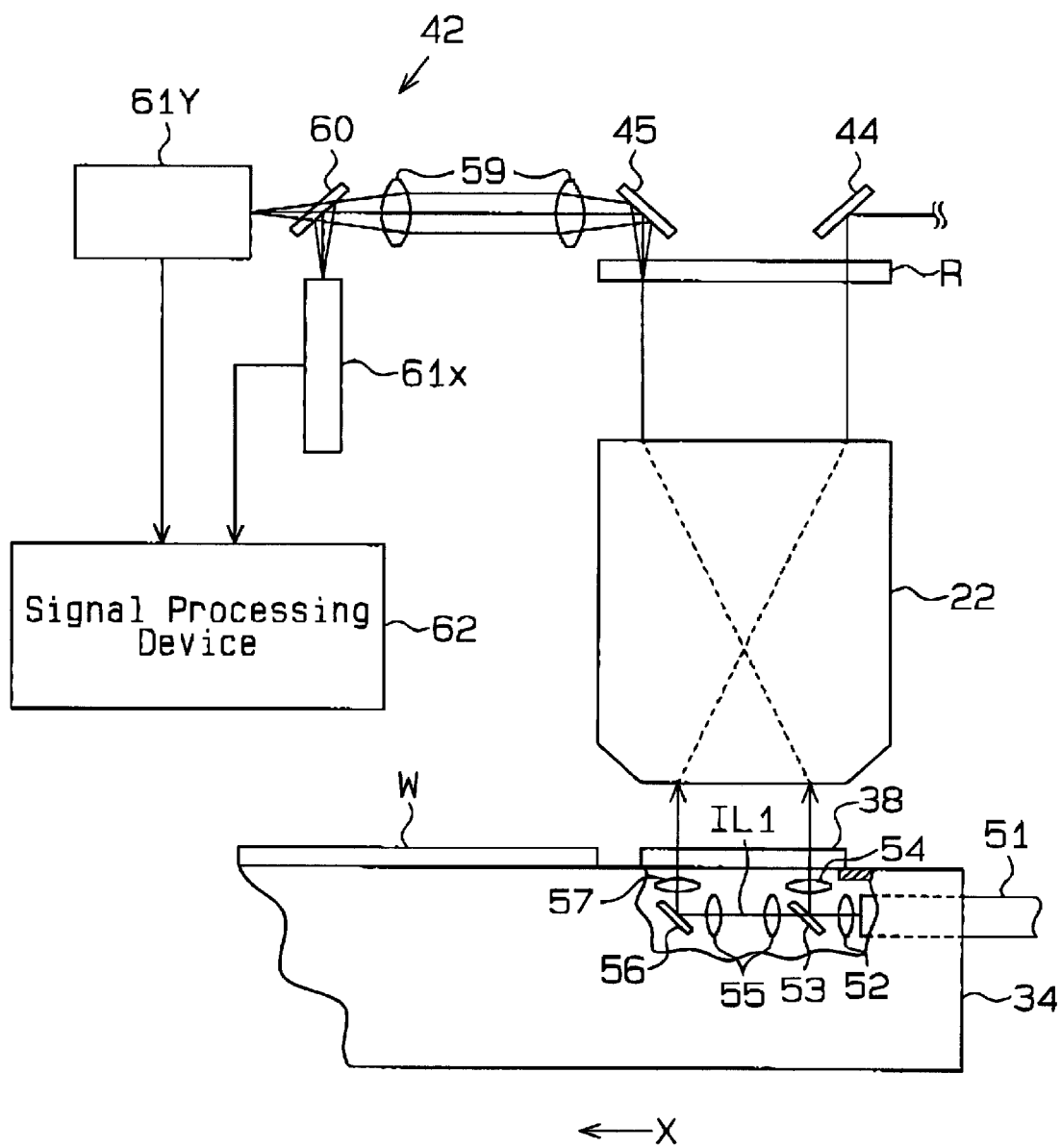
FIG. 3 is a schematic view showing a reticle alignment microscope of the exposure apparatus of FIG. 1 and its peripheral structure.
Figure 4:
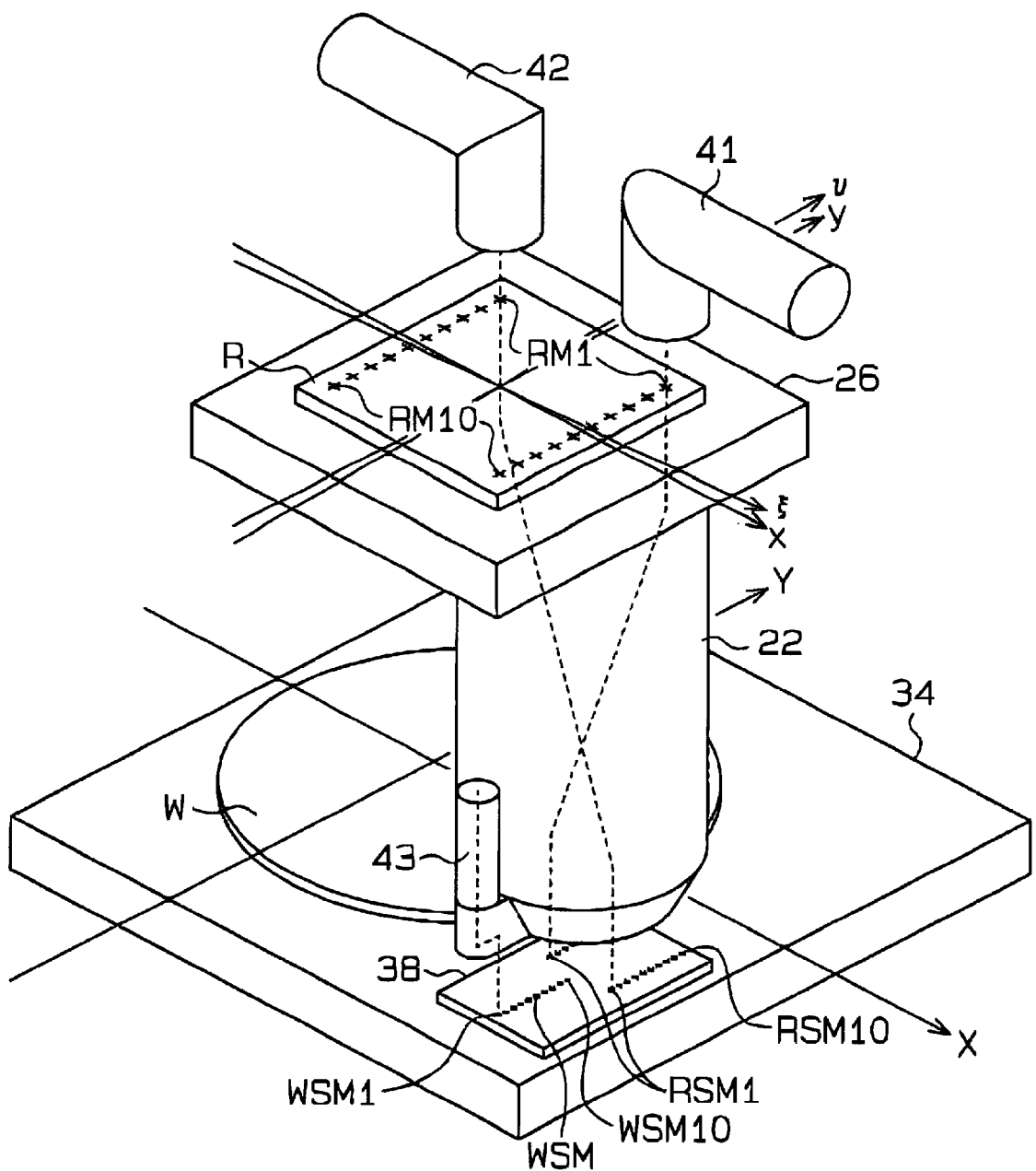
FIG. 4 is a perspective view showing a detection structure for detecting a reticle mark and various reference marks on a reference mark plate in the exposure apparatus of FIG. 1.

The RA microscopes 41, 42, have a structure as described below. That is, as shown in FIGS. 3 and 4, an illumination light IL1 from an external light source, which is not shown, and having the same wavelength as the exposure light EL is guided via an optical fiber 51 to the interior of the Zθ axis drive stage 34. The illumination light IL1 is transmitted by a lens 52, a beam splitter 53, and a lens 54 to illuminate some of multiple sets (ten in this embodiment) of RA reference marks RSMn (n=1 to 10 ) formed on the reference mark plate 38. The light that passes through the beam splitter 53 proceeds to a lens system 55, a mirror 56, and a lens 57 and illuminates the other side of the RA reference marks RSMn of the same set.

The illumination light IL1 reaches multiple sets (ten in this embodiment) of RA reference marks RMn (n=1 to 10) formed on the reticle R via the optical projection system 22 and generates an image of the RA reference mark RSMn on the reticle mark RMn. Each reticle mark RMn is located at a position corresponding to the associated RA reference mark RSMn. For example, the projection image of a reference mark RSM1 is imaged on the reticle mark RM1, and the projection image of a reference mark RSM2 is imaged on the reticle mark RM2.

The image of the RA reference mark RSMn and the light from the reticle mark RMn proceeds to the deflection mirrors 44, 45, and a lens system 59 and reaches a half mirror 60 to be divided into two. The halves of the light respectively enter the imaging surfaces of an X axis imaging device 61X and a Y axis imaging device 61Y, each of which preferably is a two dimensional CCD. The received light image on the imaging surface is converted to an imaging signal by means of photoelectric transfer, and the imaging signal is input to a signal processing device 62. Under control of the main control system 30 of FIG. 1, the signal processing device 62 uses the imaging signal to obtain the deviation amount of each reticle mark RMn relative to the associated RA reference mark RSMn. In this embodiment, the RA microscopes 41, 42 simultaneously detect one set of the RA reference marks RSMn and the corresponding reticle marks RMn. After the detection, the wafer Y axis drive stage 32 and the reticle Y axis drive stage 25 are moved to detect the next set of the RA reference mark RSMn and the corresponding reticle mark RMn. FIG. 4 shows the first RA reference mark RSM1 and the corresponding reticle mark RM1 being detected by the RA microscopes 41, 42.

Figure 5:
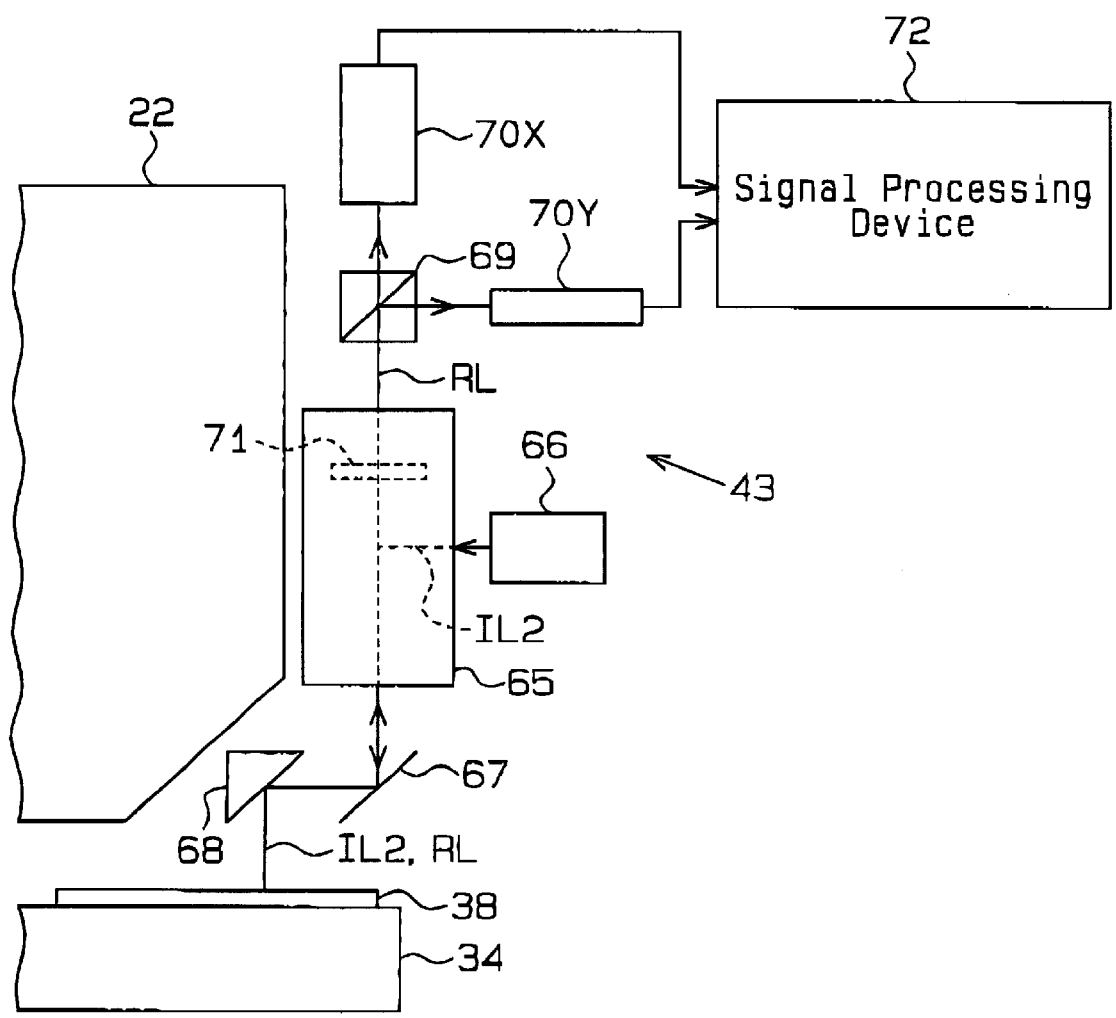
FIG. 5 is a schematic diagram showing a wafer alignment apparatus of the exposure apparatus of FIG. 1.

As shown in FIG. 5, the WA device 43 includes an optical alignment system (hereafter referred to as "FIA optical system") 65, which preferably uses an image processing technique that uses a wide wavelength band. That is, an illumination light IL2 from an illumination light source 66 via the FIA optical system 65 is reflected by a mirror 67 and, after being deflected by a deflection mirror 68, illuminates a wafer mark formed on the reference mark plate 38. The reflection light RL from the wafer mark returns to the FIA optical system 65 along the same optical path, passes through the FIA optical system 65, and enters a half prism 69. The half prism 69 divides the reflection light RL into two beams. One of the beams that exits the half prism 69 enters an X axis imaging device 70X, which preferably is a two dimensional CCD, and generates an image of the wafer mark on its imaging surface. The other beam that exits the half prism 69 enters a Y axis imaging device 70Y, which preferably is a two dimensional CCd, and generates an image of the wafer mark on its imaging surface. In this state, the image of an index mark on an index plate 71, which is arranged in the FIA optical system 65 is simultaneously generated on the imaging surfaces of the imaging devices 70X, 70Y. The received light image on the imaging surface is converted to an imaging signal by means of photoelectric transfer, and the imaging signal is input to a signal processing device 72. Under control of the main control system 30 of FIG. 1, the signal processing device 72 uses the imaging signal to obtain the deviation amount of the wafer mark relative to the index mark.

The deviation amount of the position of the index mark relative to a base line amount, which is the gap between a reference point of the optical projection system 22 and the reference point of the WA device 43, must be obtained. In this case, the reference point of the optical projection system 22 is the center of the slit-like illumination area, or the center of the optical axis of the optical projection system 22, and the reference point of the WA device 43 is the center of the observation area DFw.

The measurement of the offset amount is performed as follows. As shown in FIGS. 4 and 5, the reference mark plate 38 is first moved to a position corresponding to the WA device 43. In this state, the illumination light IL2 of the illumination light source 66 illuminates grid-like wafer alignment reference marks (hereafter referred to as "WA reference marks") formed on the reference mark plate 38. The reflection light RL from the WA reference marks WSM generates an image of the WA reference marks WSM on the imaging surfaces of the imaging devices 70X, 70Y. In this state, the image of the index mark is simultaneously generated on the imaging surfaces. The received light images on the imaging surfaces are converted to an imaging signal by means of photoelectric transfer, and the imaging signal is input to the signal processing device 72. Under control of the main control system 30 of FIG. 1, the signal processing device 72 uses the imaging signal to measure points of the index mark in correspondence with the WA reference mark WSM. In other words, the position of the index mark relative to each grid point WSMn (n=b 1to 10) of the WA reference mark WSM on the imaging surfaces of the imaging devices 70X, 70Y is measured. The deviation amount of the index mark from each grid point WSMn is calculated as an offset amount. Further, the deviation amount of the index mark from the WA reference mark WSM and the deviation amount of the wafer mark image from the index mark is used to calculate the deviation amount of the wafer mark from the WA reference mark WSM. Based on the deviation amount, the wafer Y axis drive stage 32 and the wafer X axis drive stage 33 are finely moved to perform wafer alignment, that is, position the wafer W at a predetermined position.

The shape and position of each mark formed on the reticle R and the reference mark plate 38 will now be described in detail.

Figure 6A:
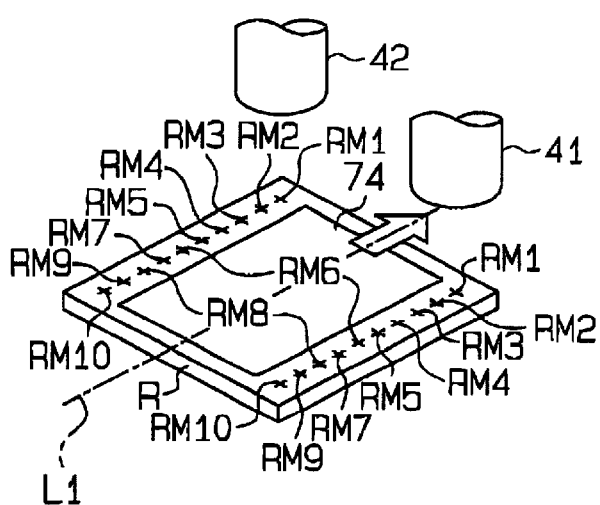
FIG. 6(a) is a perspective view showing a reticle.
Figure 6B:
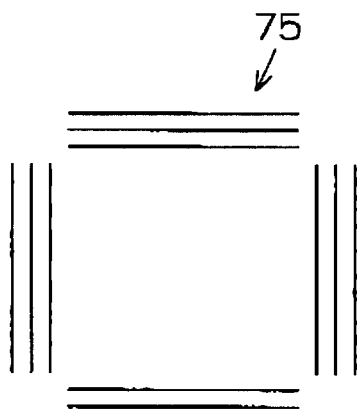
FIG. 6(b) is a plan view showing a mark pattern of the reticle mark.

As shown in FIG. 6(a), the reticle marks RMn are arranged on the reticle R on each side of a pattern area 74, on which a circuit pattern is formed, along the scanning direction of the reticle R. As shown in FIG. 6(b), each reticle mark RMn is formed by a mark pattern 75. More specifically, although the mark pattern 75 is simply shown as a cross-like mark in FIG. 6(a), it is actually formed by two sets of triple-line patterns having a predetermined gap therebetween in the X direction, and two sets of triple-line patterns having a predetermined gap therebetween in the Y direction. A pair of the mark patterns 75 is arranged symmetrically about a straight line L1 extending through the middle of the pattern area 74 in the scanning direction. Further, each reticle mark RMn is arranged to correspond with the position of each RA reference mark RSMn on the reference mark plate 38 projected by the optical projection system 22 of FIG. 1.

Figure 7A:
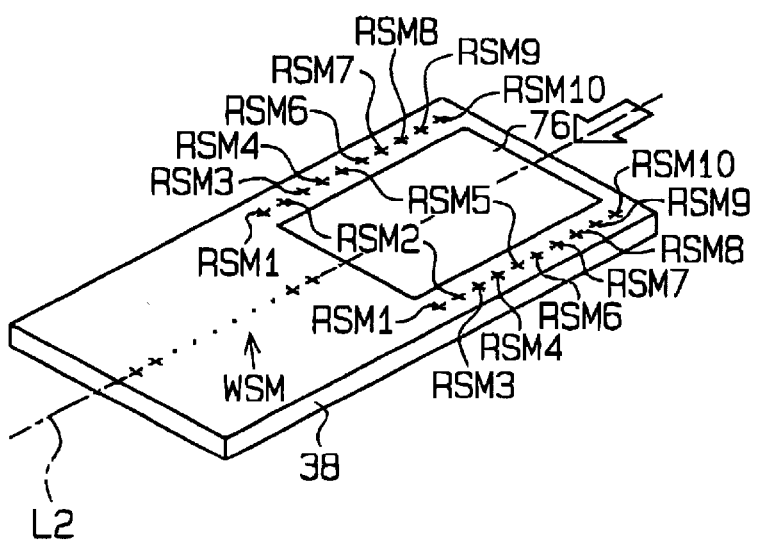
FIG. 7(a) is a schematic perspective view showing a reference mark plate.

As shown in FIG. 7(a), the reference mark plate 38 includes a pattern projection area 76, on which the circuit pattern of the reticle R is projected. The RA reference marks RSMn are formed on the reference mark plate 38 on each side of the pattern projection area 76. The WA reference marks WSM are formed on the reference mark plate 38 outside the pattern projection area 76 along a middle line L2.

Figure 7B:
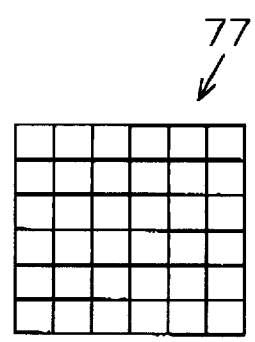
FIG. 7(b) is a plan view showing a reference mark pattern of the reticle alignment reference mark.
Figure 9A:
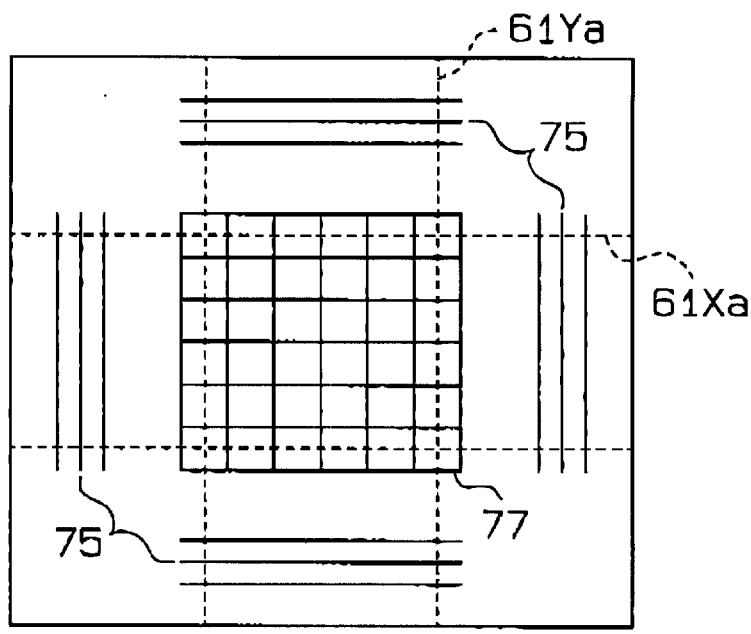
FIG. 9(a) is a diagram illustrating a received light image of an imaging device of FIG. 3, and FIG. 9(b) and FIG. 9(c) are diagrams illustrating an imaging signal in the X axis and Y axis directions based on the received light image of FIG. 9(a)
Figure 9B:
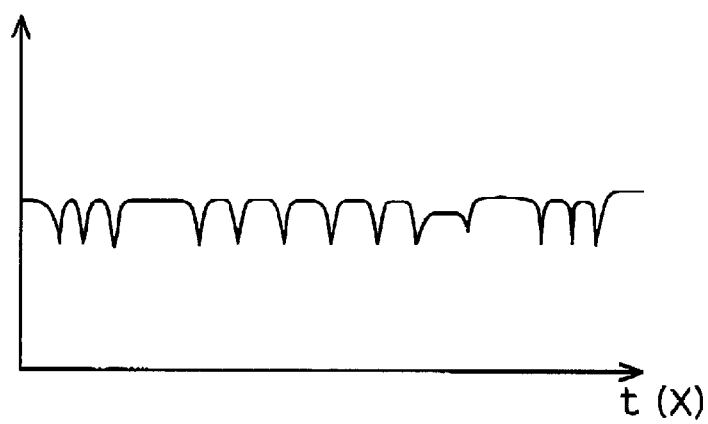
Figure 9C:
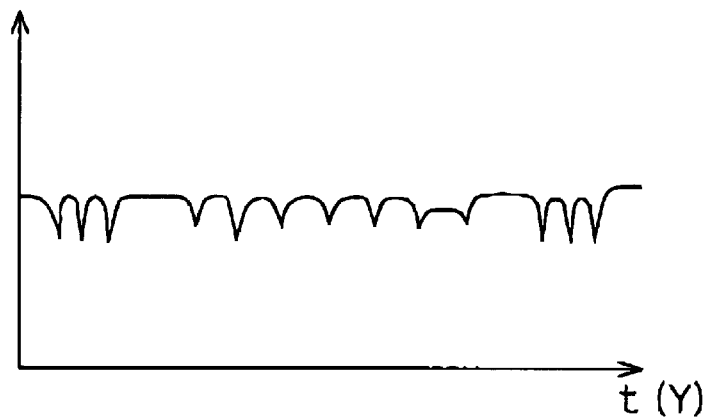

As shown in FIG. 7(b), each of the RA reference marks RSMn is formed by a reference mark pattern 77. A pair of the reference mark patterns 77 is arranged symmetrically about the straight line L2. Although each reference mark pattern 77 is simply shown as a cross-like mark in FIG. 7(a), it is actually a grid-like pattern having six lines and six rows, as shown in FIG. 7(b). As shown in FIG. 9(a), the reference mark patterns 77 are sized to fit within the mark pattern 75 when the optical projection system 22 of FIG. 1 projects the mark pattern 75 of the reticle mark RMn. The WA reference marks WSM are also formed by grid-like patterns (not shown) having a predetermined pitch in the X axis direction and the Y axis direction.

The positional relationship between the RA reference marks RSMn and the WA reference marks WSM on the reference mark plate 38 will now be discussed.

As shown in FIGS. 8(a) to 8(c), the WA reference marks WSM are arranged as grid points WSMn separated by a predetermined distance from a median point between a pair of the reference mark patterns 77 in the scanning direction (Y axis direction). The predetermined distance is substantially equal to the base line amount, that is, the distance between the optical axis of the optical projection system 22 and the center of the observation area DFw of the WA device 43 on the reference mark plate 38. In other words, each of the grid points WSM1, WSM2, . . . , WSM10 are arranged at a position separated by the base line amount in the Y axis direction from a median point between each pair of the RA reference marks RSM1, RSM2, . . . , RSM10.

In the exposure apparatus of this embodiment, a plurality of reticle alignment modes are selected and a plurality of circuit patterns on the reticle R are double exposed on each shot area of the wafer W. Exposure processing methods, including each of the reticle alignment modes, is released through the keyboard 50. The exposure processing methods include a fine reticle alignment exposure process (hereinafter referred to as "fine exposure"), a fixed point reference simple reticle alignment exposure process (hereinafter referred to as "fixed point reference simple exposure"), and partial updated simple reticle alignment exposure process (hereafter referred to as "partial update simple exposure").

[Fine Position Measurement]

The detection of reticle R position information using the RA microscopes 41, 42 (fine position measurement mode (hereafter referred to as fine mode)) performed during fine exposure will now be discussed.

The reticle R is placed on the reticle fine drive stage 26 of the reticle stage 21 by a reticle transport apparatus (not shown). As shown in FIG. 8(b), the reticle marks RM1 at one end of the reticle R and the corresponding RA reference marks RSM1 of the reference mark plate 38 are detected by the RA microscopes 41, 42 of FIG. 4.

As shown in FIG. 1, FIG. 2, and FIG. 4 to FIG. 8, the wafer Y axis drive stage 32 and the wafer X axis drive stage 33 are used to move the RA reference marks RSM1 of the reference mark plate 38 on the Zθ drive stage 34 into the detection areas DFrw of the RA microscopes 41, 42. Simultaneously, the reticle Y axis drive stage 25 is driven to move the reticle marks RM1 into the detection areas DFrw of the microscopes 41, 42.

At the first pause position, the RA reference marks RSM1 are illuminated from below by the illumination light IL1, and the projection image of the RA reference marks RSM1 is generated on the reticle mark RM1 by the optical projection system 22. The projection image of the RA reference marks RSM1 and the image of the reticle marks RM1 are formed as a synthesized image on the imaging surface 61Xa of the X axis imaging device 61X, which is encompassed by the broken lines in FIG. 9(a). The synthesized image is also generated on the imaging surface 61Ya of the Y axis imaging device 61Y, which is encompassed by the broken lines in FIG. 9(a). The position of the reticle marks RM1 relative to the RA reference marks RSM1 is obtained from the imaging signal. In this state, the WA device 43 simultaneously measures the position of the grid point WSM1 of the WA reference marks WSM on the reference mark plate 38.

Then, in synchronism with the movement of the Zθ axis drive stage 34 in the Y axis direction from the first pause state of FIG. 8(b), the reticle fine drive stage 26 is moved in a direction opposite the Y axis direction (−Y axis direction). In this state, as shown in FIG. 8(b) and FIG. 8(c), the movement is performed in a stepped manner so that pauses are taken when each of the RA reference marks RSM1 to RSM10 and the grid points WSM1 to WSM10 of the WA reference marks WSM are arranged below the observation areas DFrw and the WA device 43 (observation area DFw). Further, the reticle marks RM1 to RM10 are moved sequentially in a stepped manner under the reticle R observation areas DFrr of the RA microscopes 41, 42. The position of each reticle mark RMn relative to the corresponding RA reference mark RSMn is measured.

Figure 10:
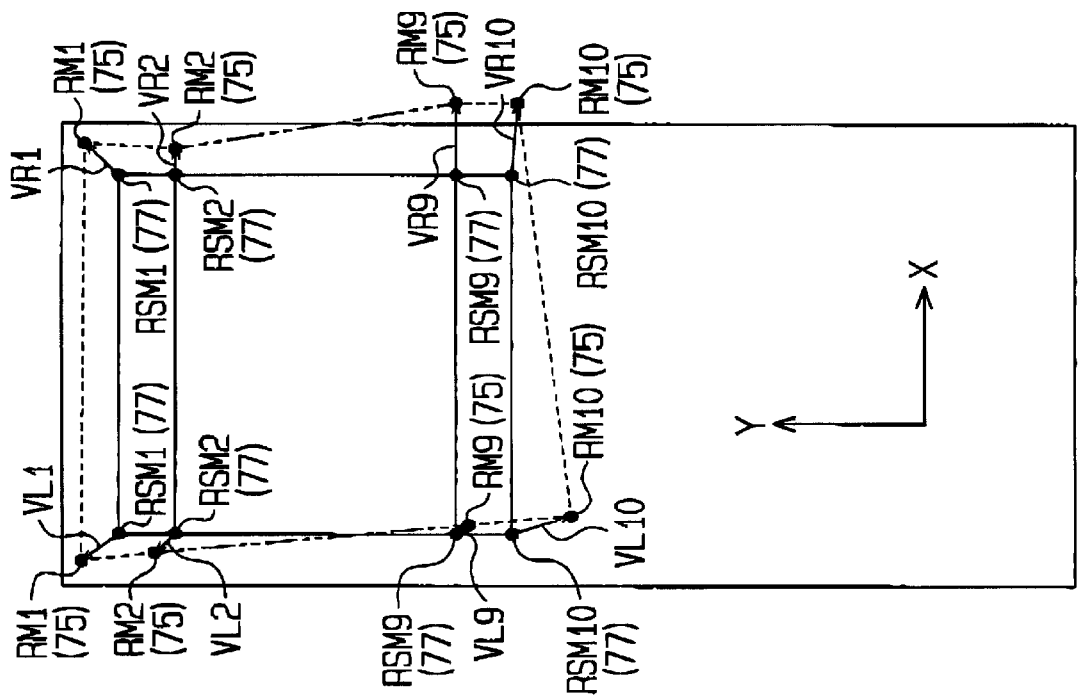
FIG. 10 is a diagram showing an error vector measured during reticle alignment.

FIG. 10 illustrates part of the measurement result (the RA reference marks RSM1, RSM2, RSM9, RSM10 and the corresponding RM1, RM2, RM9, RM10) for the sake of brevity.

Error vectors corresponding to the positional deviation between the images of the RA reference marks RSMn and the measured reticle marks RMn will now be discussed. The error vector between the images of left reference mark patterns 77 and the corresponding left mark patterns 75 are represented as error vectors VLn (n=1 to 10), and the error vector between the images of the right reference mark patterns 77 and the corresponding right mark patterns 75 are represented as VRn (n=1 to 10).

The relative positional deviation in the X axis direction between the actually measured reference mark patterns 77 and the mark patterns 75 is represented as VLnX', VRnX'. Further, the relative positional deviation in the Y axis direction is represented as VLnY', VRnY'. When there are relative positional deviations VLnX', VLnY', VRnX', VRnY', the X axis direction coordinate value measured by the reticle interferometer 28 (i.e., the coordinate value obtained by the laser beam LRx) is represented by Rexn (n=1 to 10). The y axis direction coordinate value measured by the reticle interferometer 28 (i.e., the coordinate value obtained by the laser beam LRy1, LRy2) is represented by Rey1n (n=1 to 10) and Rey2n (n=1 to 10). Further, the X axis direction coordinate value measured by the wafer interferometer 36 (i.e., the coordinate value obtained by the laser beam LWX) is represented by WaXn (n=1 to 10). The Y axis direction coordinate value measured by the interferometer 36 (i.e., the coordinate value obtained by the laser beams LWY1, LWY2) is represented by WaY1n (n=1 to 10) and WaY2n (n=1 to 10). In this case, as shown in FIG. 2(a) and FIG. 2(b), the X direction gap between the laser beams LWY1, LWY2 at the wafer W side is I1, and the gap between the laser beams LRy1, LRy2 at the reticle R side is I2.

For example, in FIG. 8(b), the projected image position of the reticle mark RM1 and the projected image position of the RA reference mark RSM1 are each controlled using the reticle interferometers 28 and the wafer interferometers 36. Thus, when measuring each of the marks RM1, RSM1, measurement errors (measured value–set value) ΔRex1, ΔRey11, ΔRey21, ΔWaX1, ΔWaY11, ΔWaY21 of the respective coordinates Rex1, Rey11, Rey21, which are measured by the reticle interferometer 28, and the coordinates WaX1, WaY11, WaY21, which are measured by the wafer interferometer 36, are produced due to trailing errors of each stage. The measurement error is included in relative positional deviations VL1X', VL1Y', VR1X', VR1Y'.

Thus, as shown below by formula (1) to formula (4), the measurement errors are subtracted from the relative positional deviations to obtain the X axis component VLnX and the Y axis component VLnY of the error vector VLn of the reticle alignment of FIG. 10 and the Y axis component VRnX and the Y axis component VRnY of the error vector VRn. In each of the next formulas (1) to (4), (1/M) represents the magnification of the optical projection system 22.

$$VLnX = VLnX' - \frac{\Delta Rexn}{M} - \Delta WaXn \quad (1)$$

$$VLnY = \\ VLnY' - \frac{\Delta Rey1n}{M} - \left(\frac{\Delta WaY1n + \Delta WaY2n}{2} - \frac{(\Delta WaY1n - \Delta WaY2n)l2}{l1}\right) \quad (2)$$

$$VRnX = VRnX' - \frac{\Delta Rexn}{M} - \Delta WaXn \quad (3)$$

$$VRnY = \\ VRnY' - \frac{\Delta Rey2n}{M} - \left(\frac{\Delta WaY1n + \Delta WaY2n}{2} - \frac{(\Delta WaY1n - \Delta WaY2n)l2}{l1}\right) \quad (4)$$

As described above, when reticle alignment is performed at the positions of the reticle marks RMn and the corresponding RA reference marks RSMn, the four data of VLnX, VLnY, VRnX, and VRnY are measured for each reticle mark RMn. That is, whenever the reticle is exchanged, a total of 40 (4×10) data is obtained. The actual measurement data is stored in a memory of the main control system 30 as coordinates (Dxn, Dyn) of the projected image of each mark pattern 75 of the reticle mark RMn.

It is very difficult to place the reticles R on the reticle stage 21 at exactly the same position in exactly the same direction (i.e., exactly the same arrangement) each time the reticle is exchanged. Further, the level of expansion, compression, and distortion differs for each reticle R. In this case, the following are problematic error factors.

(a) Rotation θ of the reticle R: This is an error resulting from slight inclination of the arrangement direction of the reticle R relative to the reticle stage coordinate system (x, y). This is represented by residual rotational error of the coordinate system (ξ, ν) of the reticle R relative to the reticle stage coordinate system (x, y). The coordinate system (ξ, ν) is determined using the wafer coordinate system (X, Y) projected on the reticle R at the wafer stage 23 side as a reference.

(b) Perpendicularly ω of the coordiante system (ξ, ν) of the reticle R: This is the error resulting from distortion of the reticle R causing the pattern on the reticle R to lack parallelism in the ξ axis direction and the u axis direction. This is equivalent to the ξ axis and the u axis not being accurately perpendicular to each other, and the perpendicularity ω is represented as the perpendicularity error.

(c) Magnification errors Rx, Ry of the reticle R coordinate system (ξ, ν) in the ξ axis direction and the u axis direction:

This is the error caused when there is an error in the length of the pattern on the reticle R due to expansion and compression, etc. of the reticle R or when the projection magnification of the optical projection system PL differs from the designed value (1/M). The error is represented as magnification errors Rx and Ry in the respective ξ axis direction and u axis direction. The magnification error Rx in the ξ axis direction is represented as the ratio between the actually measured value and the designed value of the gap in the ξ axis direction between two reticle marks RMn. Further, the magnification error Ry in the u axis direction is represented as the ratio between the actually measured value and the designed value of the gap in the u axis direction between two reticle marks RMn.

(d) Offset Ox, Oy of the coordinate system (ξ, ν) on the reticle R relative to the reticle stage coordinate system (x, y): This is the error resulting from a slight difference in the reticle stage coordinate system (x, y) of the reticle R relative to its designed arrangement position. It is represented as an offset error of the home position of the coordinate system (ξ, ν) relative to the home position of the coordinate system (x, y).

Due to these error factors, the coordinate (Dxn, Dyn) of the projection image of the reticle mark RMn does not match the actual coordinate of the reticle mark RMn (i.e., the coordinate (Fxn, Fyn) on the reticle stage coordinate system (x, y)). Taking the error factors (a) to (d) into consideration, the conversion of a coordinate (Dxn, Dyn) to a coordinate (Fxn, Fyn) is represented by the following formula (5). In formula (5), only the linear components for each error factor are converted and approximated.

$$\begin{bmatrix} Fxn \\ Fyn \end{bmatrix} = \begin{bmatrix} Rxp & -Rxp \cdot (\omega p + \theta p) \\ Ryp \cdot \theta p & Ryp \end{bmatrix} \begin{bmatrix} Dxn \\ Dyn \end{bmatrix} + \begin{bmatrix} Oxp \\ Oyp \end{bmatrix} \quad (5)$$

Further, when the non-linear error components of the reticle stage coordinate system (x, y) are respectively represented by εxn, εyn, the following formula (6) is satisfied.

$$\begin{bmatrix} \varepsilon xn \\ \varepsilon yn \end{bmatrix} = \begin{bmatrix} Fxn \\ Fyn \end{bmatrix} - \begin{bmatrix} Dxn \\ Dyn \end{bmatrix} = \\ \begin{bmatrix} 1 - Rxp & -Rxp \cdot (\omega p + \theta p) \\ Ryp \cdot \theta p & 1 - Ryp \end{bmatrix} \begin{bmatrix} Dxn \\ Dyn \end{bmatrix} + \begin{bmatrix} Oxp \\ Oyp \end{bmatrix} \quad (6)$$

Then, the values of each of conversion parameters Rxp, Ryp, θp, ωp, Oxp, Oyp for the fine mode position measurement are calculated through least square approximation so that the non-linear error (εxn, εyn) becomes minimal. The values of the calculated conversion parameters Rxp, Ryp, θp, ωp, Oxp, Oyp and the coordinate (Dxn, Dyn) of the projected image of each reticle mark RMn are used in formula (5) to calculate the target coordinate (Fxn', Fyn') in the article stage coordinate system (x, y), which is the positioning target. The reticle fine drive stage 26 is then finely moved to position the reticle R so that the coordinate (Fxn, Fyn) to each reticle mark RMn matches the target coordinate (Fxn', Fyn').

In this manner, the positions of all of the reticle marks Rmn are measured by the RA microscopes 41, 42 and all six conversion parameters Rxp, Ryp, θp, ωp, Oxp, Oyp are calculated each time a reticle R is placed on the reticle stage 21 during position measurement in the fine mode.

[Fixed Point Reference Simple Position Measurement]

The detection operation of the reticle R position information using the RA microscopes 41, 42 during the fixed point reference simple exposure (fixed point reference simple position measurement mode (hereinafter referred to as (fixed point reference simple mode)) will now be discussed.

The fixed point reference simple mode is effective when, for example, performing multiple exposure on the shot areas of a single wafer W using a plurality of the reticles R having different patterns. For example, when a first reticle R1 is temporarily exchanged with a second reticle R2 and the first reticle R1 is then returned to the reticle stage 21 within a predetermined time period (e.g., the processing time of one lot of wafers W), among the reticle marks RMn on the first reticle R1, the position of only one set of reticle marks is measured by the RA microscopes 41, 42 as certain reference points. In this case, for example, the reticle mark RM1 is a reference reticle mark serving as the certain reference point.

When, for example, the first reticle R1 is the first to be used in the lot being processed, the positions of all of the reticle marks RMn on the first reticle R1 are measured in the fine mode. The coordinates (Dpxn, Dpyn) of each reticle mark RMn measured in the fine mode are stored in the main control system 30.

When the first reticle R1 is positioned again on the reticle stage 21, a deviation amount (ΔDx1, ΔDy1) between coordinate (Dpx1, Dsy1), which is measured during the most recent accurate position measurement, and an updated coordinate (Dsx1, Dsy1), which is obtained in the present measurement, is first calculated from the following formula (7).

$$\begin{bmatrix} \Delta Dx1 \\ \Delta Dy1 \end{bmatrix} = \begin{bmatrix} Dpx1 \\ Dpy1 \end{bmatrix} - \begin{bmatrix} Dsx1 \\ Dsy1 \end{bmatrix} \quad (7)$$

With regard to the other reticle marks RM2 to RM10, assuming that the coordinates (Dpx2, Dpy2) to (Dpx10, Dpy10), which are measured during the most recent fine measurement, are deviated from, the coordinates are corrected using the deviation amount (ΔDx1, ΔDy1) of the reference reticle mark RM1 through the following equation (8).

$$\begin{bmatrix} Dsxn \\ Dsyn \end{bmatrix} = \begin{bmatrix} Dpxn \\ Dpyn \end{bmatrix} + \begin{bmatrix} \Delta Dx1 \\ \Delta Dy1 \end{bmatrix} \quad (n = 2\text{–}10) \quad (8)$$

The compensated coordinates (Dsx2, Dsy2) to (Dsx10, Dsy10) and the newly obtained coordinate (Dsx1, Dsy1) of the reference reticle mark RM1 are used as the coordinate (Dxn, Dyn) in formulas (5) and (6). This calculates conversion parameters Rxs, Rys, θs, ωs, Oxs, Oys corresponding to the conversion parameters Rxp, Ryp, θp, ωp, Oxp, Oyp, respectively. In the same manner as fine position measurement, the target coordinate (Fxn', Fyn') of each reticle mark RMn is calculated to position the reticle R so that it matches the target coordinate (Fxn', Fyn').

In the fixed point reference simple mode, a reference point equalizing process for the initial fine mode position measurement is set through the keyboard 50. In the reference point equalizing process, the position of the reference reticle mark RM1 is measured a multiple number of times and an average value of the obtained coordinate is computed. The average value is employed as the coordinate (Dpx1, Dpy1) of the reference reticle mark RM1 in the fixed point reference simple mode.

[Partial Update Simple Position Measurement]

The detection operation of the reticle R position information using RA microscopes 41, 42 during partial update exposure (partial update simple position measurement mode (hereafter referred to as "partial update simple mode") will now be discussed.

In the same manner as the fixed point reference simple mode, the partial update simple mode is effective when, for example, performing multiple exposure on the shot areas of a single wafer W using a plurality of the reticles R. In the same manner as the fixed point reference simple mode, the position measurement of each reticle mark RMn is performed in the fine mode during the predetermined time period in the same manner as the fixed point reference simple mode. When the reticle R, which coordinate (Dpxn, Dpyn) has been stored, is placed on the reticle stage 21 again, the coordinate (Dsx1, Dsy1) of only the reference reticle mark RM1 is measured by the RA microscope. In this case, the conversion parameters Rxp, Ryp, θp, ωp, Oxp, Oyp obtained during the most recent fine measurement are also stored in the main control system 30.

Among the present newly measured reference reticle mark RM1 coordinate (Dsx1, Dsy1) and the conversion parameters obtained during the most recent fine position measurement, the parameters (deformation component) Rxp, Typ, ωp, which are related with expansion, compression and distortion of the reticle R, are used in the following equation (9). This obtains the arranged position and arranged direction of the reticle R, or parameters (offset components) θs, Oxs, Oys relates with the reticle R arrangement. In other words, in the same manner as the fine position measurement, in the following formula (9), the offset components θs, Oxs, Oys are calculated through least square approximation so that the non-linear error (εxn, εyn) is minimized.

$$\begin{bmatrix} \varepsilon xn \\ \varepsilon yn \end{bmatrix} = \begin{bmatrix} 1 - Rxp & -Rxp \cdot (\omega p + \theta s) \\ Ryp \cdot \theta s & 1 - Ryp \end{bmatrix} \begin{bmatrix} Dsxn \\ Dsyn \end{bmatrix} + \begin{bmatrix} Oxs \\ Oys \end{bmatrix} \quad (9)$$

The offset components θp, Oxp, Oyp stored in the main control system 30 are updated by the newly obtained offset components θs, Oxs, Oys. The values of the conversion parameters Rxp, Ryp, θs, ωp, Oxs, Oys and the coordinates (Dpxn, Dpyn) of the projected image of each reticle mark RMn, which are obtained through the fine mode position measurement, are used in the formula (5) to calculate the target coordinate (Fxn', Fyn'). The reticle R is then positioned so that the coordinate (Fxn, fyn) of each reticle mark RMn matches the target coordinate (Fxn', Fyn').

In the partial update simple mode, a reference point writing error correction process may be set through the keyboard 50 in the first fine mode position measurement. In the writing error correction, a first relative position of the mark pattern included in the reticle mark RMn is obtained from the plurality of reticle marks (e.g., the coordinates (Dpxn, Dpyn) (n=1 or 10) measured for RM1 or RM10). Then, the first relative position of each mark pattern 75 is obtained from the designed coordinate (Ddxn, Ddyn) of the prestored reticle mark Rmn. The first relative position is compared to a second relative position to calculate a presumption value of the writing error. The coordinate (Dsxn, Dsyn) of the newly measured reference reticle mark RM1 is corrected using the presumption value of the writing error.

In double exposure, when the first wafer W undergoes the first exposure with the first reticle and the second exposure with a second reticle R2, in a following second wafer W, the first and second reticles R1, R2 may be used in the any one of the following two orders.

(α) Without exchanging the reticles R1, R2, the second reticle R2 continuously performs the first exposure. The second reticle R2 is then exchanged with the first reticle R1 to perform the second exposure with the first reticle R1.

(β) Exposure is performed in the same manner as the first wafer W. Thus, the second reticle R2 is exchanged with the first reticle R1 to perform the first exposure with the first reticle R1. Then, the first reticle R1 is exchanged with the second reticle R2 to perform the second exposure.

Furthermore, to achieve double exposure, the reticles R1, R2 may also be exchanged in the following two manners.

(γ) Exposing a plural number of wafers W with the first reticle R1, and, after exchanging the first reticle R1 with the second reticle R2, exposing all of the exposed wafers W with the second reticle R2.

(δ) Exchanging the first reticle and the second reticle for each wafer W, and completing double exposure of each wafer W before proceeding to perform double exposure on the next wafer W.

The number of times the reticles R1, R2 are exchanged in (β) and (δ) is greater than that of (α) and (γ). This increases the time required to exchange and align the reticles.

In a photolithography process, which forms very fine line widths that require double exposure, the excimer laser light of KrF, ArF, F2, or the like, is often used as the light source of the exposure light. If a chemical amplification photoresist having a satisfactory resolution characteristic is not developed immediately after exposure, the wavelength of the excimer laser light causes the acid in the resist to react with alkali substances in the air. This results in the cross-sectional form of the resist subsequent to the development being undesirable.

In such case, the reticle exchange method (γ) is inappropriate for double exposure since the time from exposure to development is long. That is, when performing double exposure, it is preferred that the reticle R1, R2 be exchanged using the method of (δ). However, method (δ) increases the number of times for exchanging the reticles. This inevitably decreases the throughput of the exposure apparatus.

Next, the operation for exposing the circuit pattern of the reticle R, which is positioned in the reticle alignment mode, on each shot area of the wafer W will be described. An exposure operation that combines the reticle R exchange methods of (α) and (δ) (i.e., a method that alternately exchanges the reticle R and the wafer W) will be described.

When the reticle R is positioned on the reticle stage 21, the reticle R is illuminated in the slit-like illumination area of the exposure light EL. In this state, the reticle Y axis drive stage 25 is scanned along the Y axis at the constant speed V. During the scanning, the circuit pattern on the reticle R is illuminated by the exposure light EL from one end to the other end along the Y axis direction. The image of a slit like pattern is reduced and projected on shot areas Sn (n=1 to 52) shown in FIG. 11, to which a photosensitive resin is applied, by the optical projection system 22, which has a reducing magnification of 1/M. In this state, the wafer Y axis drive stage 32 is scanned in the opposite direction in synchronism with the reticle Y axis drive stage 25 at the constant speed V/M. This forms a latent image of the circuit pattern that is reduced to a predetermined size in each shot area Sn of the wafer W and completes a single exposure of the single shot region Sn.

When a single exposure of a single shot area Sn is completed, the wafer X axis drive stage 33 moves in a stepped manner (in some cases together with the wafer Y axis drive stage 32), and positions the next shot region Sn±1 at a position corresponding to the optical projection system 22. Then, the exposure of the next shot area Sn±1 is performed.

When exposure of all of the shot areas Sn of a single wafer W is completed and a circuit pattern must be double exposed on each shot area Sn with the second reticle R, the reticle R is exchanged. In accordance with the selected reticle alignment mode, the second reticle R is positioned and the next exposure is performed.

Figure 11:
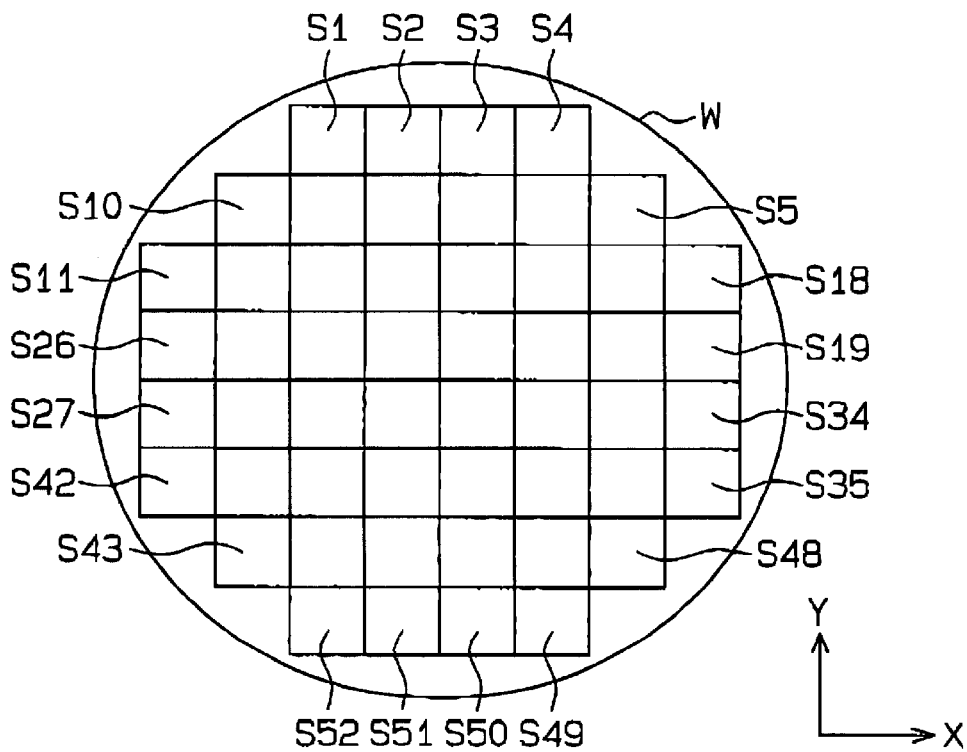
FIG. 11 is a plan view showing each shot area on a wafer.

When the exposure of a circuit pattern on every shot area Sn is completed using the second reticle R, the wafer W is exchanged. When the wafer W is exchanged, wafer alignment is performed and the wafer W is positioned on the wafer stage 23. If the final reticle R used during exposure before exchanging the wafer W will also be used to expose the next wafer W, exposure is performed sequentially from the shot area Sn of the next wafer W that corresponds to the finally exposed shot area Sn of the previous wafer W. That is, as shown in FIG. 11, for example, it is assumed that exposure of a wafer W before it is exchanged is performed in the order of shot areas S1, S2, S3, S4, S5, . . . , S10, S11, . . . , S18, S19, . . . , S26, S27, . . . S48, S49, S50, S51, S52. In this case, the next wafer W is exposed sequentially in the opposite order, that is, from the shot area S52 to S1.

[Exposure Process Sequence]

An example of a sequence when an exposure process executed under the control of the main control system 30 and set in accordance with an input through a keyboard by an operator will now be described with reference to the flowcharts of FIG. 12 to FIG. 17. The circuit patterns of the first reticle R1 and the second reticle R2 are double exposed on each shot area Sn of the wafer W.

Figure 12:
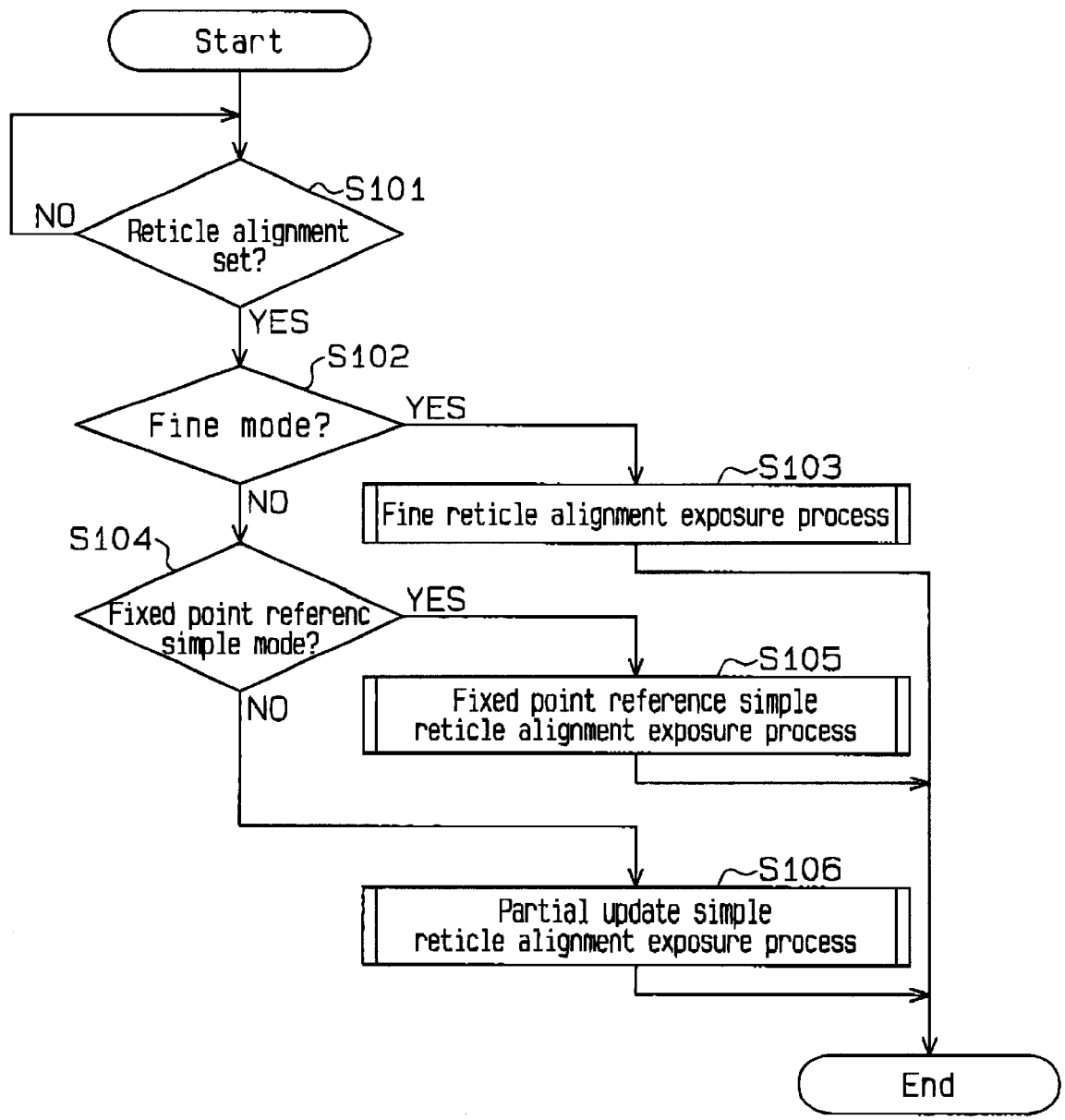
FIG. 12 is a flowchart of an exposure operation.

When the operator uses the keyboard 50 to initiate the exposure process, first, the reticle alignment mode is determined. That is, as shown in FIG. 12, it is determined whether the reticle alignment mode is set (S101). At step 101, if it is determined that the mode has not been set, a standby state, in which the operator must input a mode, is entered. If it determined that the reticle alignment mode is set in step S101, it is determined whether or not the set mode is the fine mode (S102).

If it is determined that the accurate mode is set in step S102, the fine exposure is performed in step S103. If it is determined that the set mode is not the fine mode in step S102, it is determined whether the set mode is the fixed point reference simple mode (S104).

If it is determined that the fixed point reference simple mode is set in step S104, the fixed point reference simple exposure is performed in step S105. If it is determined that the set mode is not the fixed point reference simple mode in step S104, partial update simple exposure is performed in step S106.

The fine exposure of step S103 will now be described in detail.

Figure 13:
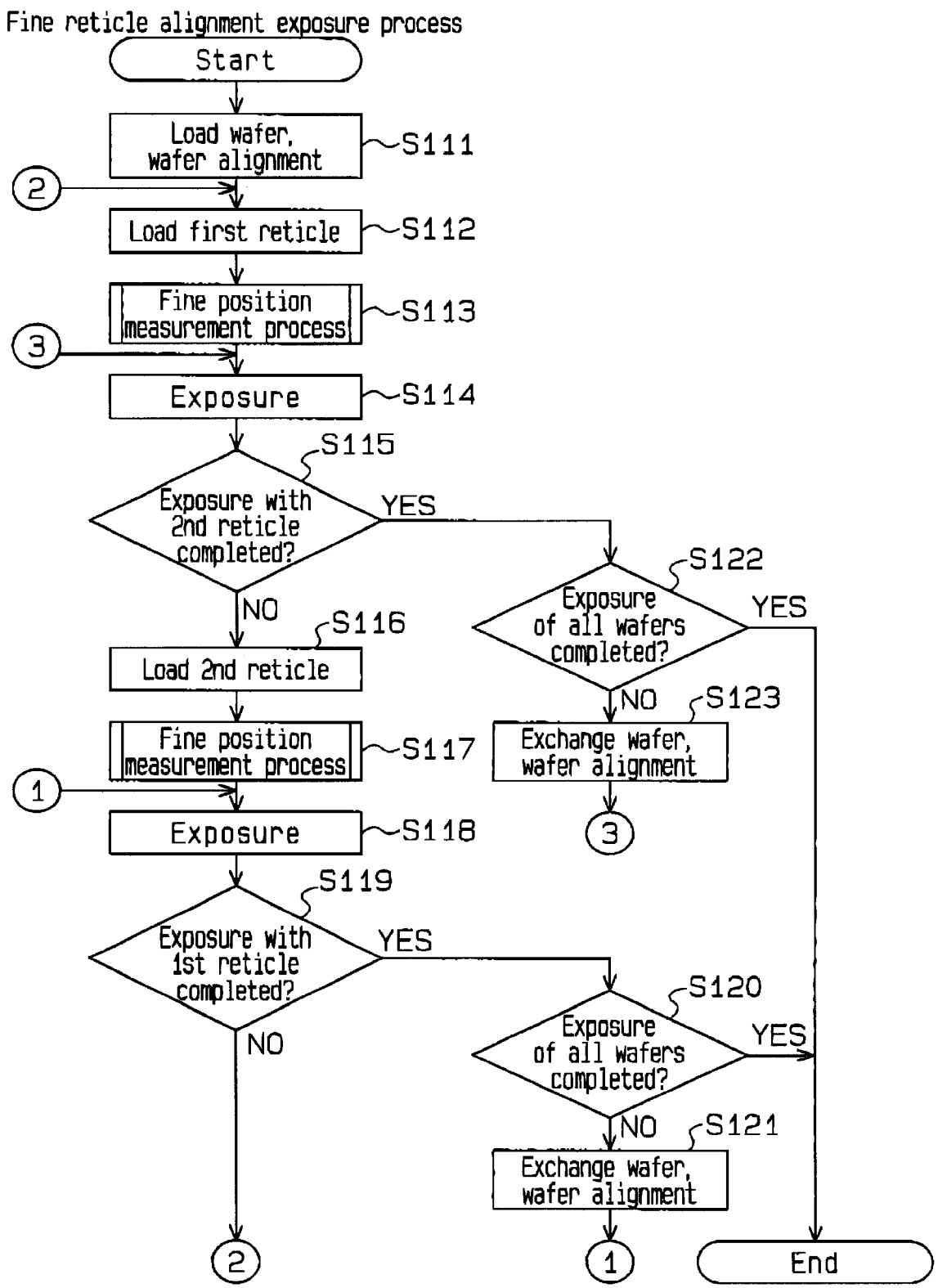
FIG. 13 is a flowchart illustrating a fine exposure operation.

As shown in FIG. 13, during fine exposure, when a wafer transport apparatus (not shown) places a wafer W on the wafer stage 23, the wafer W is positioned by the WA device 43 (S111). Then, when the reticle transport apparatus (not shown) places a first reticle R1 on the reticle stage 21 (S112), the microscopes 41, 42 perform position measurement in the fine mode. Based on the measurement result, the first reticle R1 is positioned at a predetermined position on the reticle stage 21 (S113). When the first reticle R1 is positioned, step and scan is performed to sequentially reduce and project the first circuit pattern on the shot areas Sn of the wafer W with the optical projection system 22 (S114). This forms a first latent image corresponding to the circuit pattern of the first reticle R1 on each shot area Sn.

When the exposure using the first reticle R1 of all of the shot areas Sn on a single wafer W is completed, it is determined whether or not exposure of the wafer W using the second reticle has already been performed (S115). Since this is the first exposure, the second reticle R2 has, of course, not been performed. Accordingly, proceeding to step S116, the first reticle R1 is exchanged with the second reticle R2 by the reticle transport apparatus. When the second reticle R2 is placed on the reticle stage 21, the second reticle R2 is positioned in the fine mode (S117). When the second reticle R2 is positioned, the second pattern of the second reticle R2 is sequentially reduced and projected on each shot area Sn of the wafer W (S118). This overlaps a second latent image corresponding to the circuit pattern of the second reticle R2 with the first latent image formed in step S114.

After completing exposure of all of the shot areas Sn with the second reticle R2, it is determined whether exposure with the first reticle R1 has been performed (S119). If it is determined that exposure using the first reticle R1 has already been performed in step S119, it is then determined whether exposure of all of the wafers W that are to be processed has been completed (S120). If it is determined that there still is an unprocessed wafer W in step S120, the wafer transport apparatus exchanges the exposed wafer W with a new wafer W and positions the new wafer W on the wafer stage 23 (S121).

When a new wafer W is positioned, returning to step S118, the circuit pattern of the second reticle is sequentially projected and exposed on each shot area of the new wafer W. Here, reticle exchange is not performed and exposure is performed with the second reticle R2. That is, a second latent image of the circuit pattern on the second reticle is formed on the new wafer W. Then, proceeding to step S119, it is determined that exposure has not been performed with the first reticle R1, and returning to step S112, the second reticle R2 is exchanged with the first reticle R1. At step S113, reticle alignment in the fine mode is performed and at step S114, the circuit pattern of the first reticle R1 is sequentially reduced and projected onto each shot area Sn of the wafer W. This overlaps a first latent image, which corresponds with the circuit pattern of the first reticle R1, on the second latent image formed on the new wafer.

Next, at step S115, if it is determined that exposure with the second reticle R2 has already been performed, it is determined whether exposure of all of the wafers W that are to be processed has been completed (S122). If there still is an unprocessed wafer W, the wafer W is exchanged and positioned (S123).

After the new wafer w is positioned, returning to step S114, the circuit pattern of the first reticle is sequentially projected and exposed on the first reticle at each shot area Sn of the wafer W. Here, reticle exchange is not performed and exposure is performed with the first reticle R1. That is, a first latent image of the circuit pattern on the first reticle is formed on the new wafer W. Through the processing of steps S115 to S118, the second latent image is overlapped on the first latent image. Afterward, until it is determined in steps S120 and S122 that exposure of all of the wafers W that are to be processed has been completed, the processing of step S112 to S123 is repeated.

The details of position measurement of the reticles R1, R2 in steps S113 and S117 of the fine mode will now be described in detail.

Figure 14:
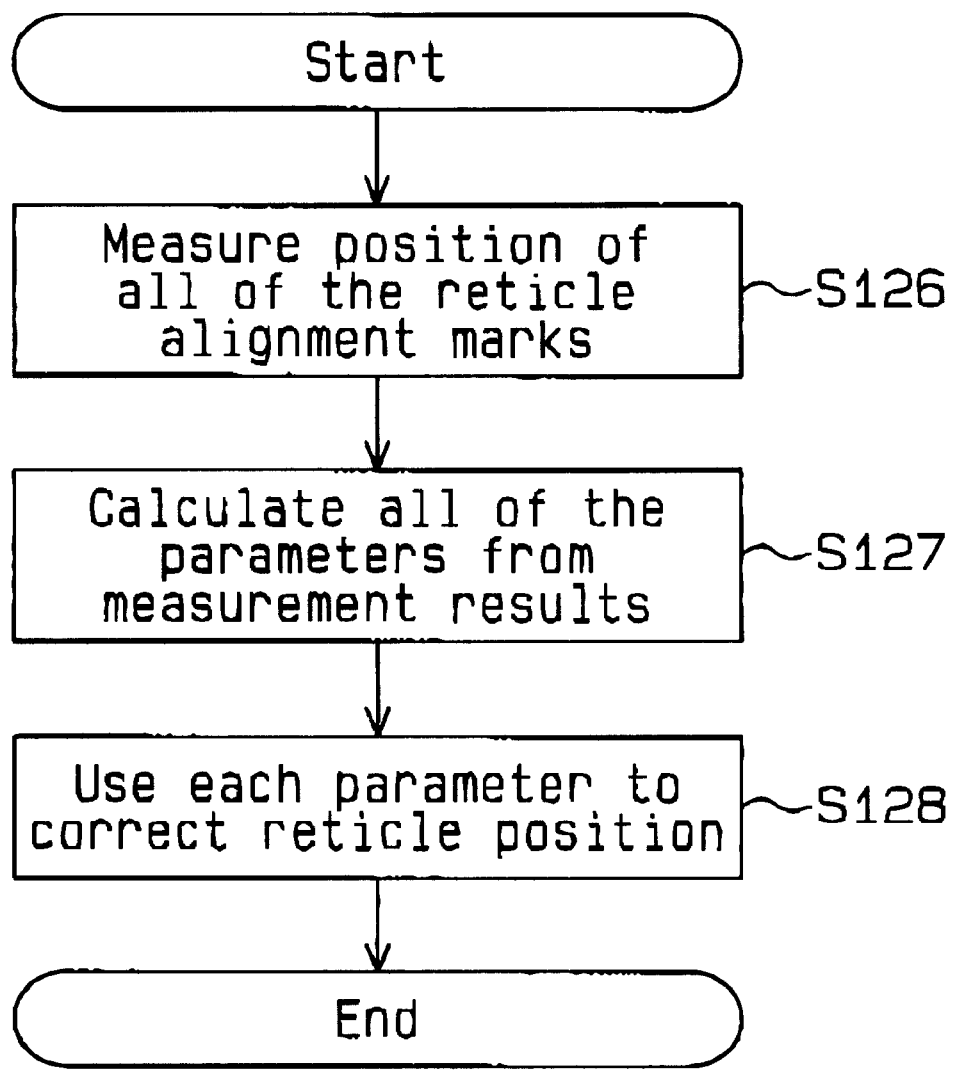
FIG. 14 is a flowchart illustrating a position measurement operation in a fine mode.

As shown in FIG. 14, during position measurement in the fine mode, the position of the RA reference marks RSMn of all of the reticle marks RMn on the reticles R1, R2 are measured with the RA microscopes 41, 42 (S126). Then, using all of the measurement results, that is, from the coordinate (Dpxn, Dpyn) of all of the reticle marks Rmn, the conversion parameters Rxp, Ryp, θp, ωp, Oxp, Oyp are calculated (S127).

The conversion parameters Rxp, Ryp, θp, ωp, Oxp, Oyp are used to convert the coordinate (Dpxn, Dpyn) to a target coordinate (Fxn', Fyn') in the reticle stage coordinate system (x, y). Then, a fine drive amount of the reticle fine drive stage 26 is adjusted so that the coordinate (Fxn, Fyn) of each reticle mark RMn substantially matches the target coordinate (Fxn', Fyn') (S128). This positions the reticles R1, R2 on the reticle stage 21.

Figure 15:
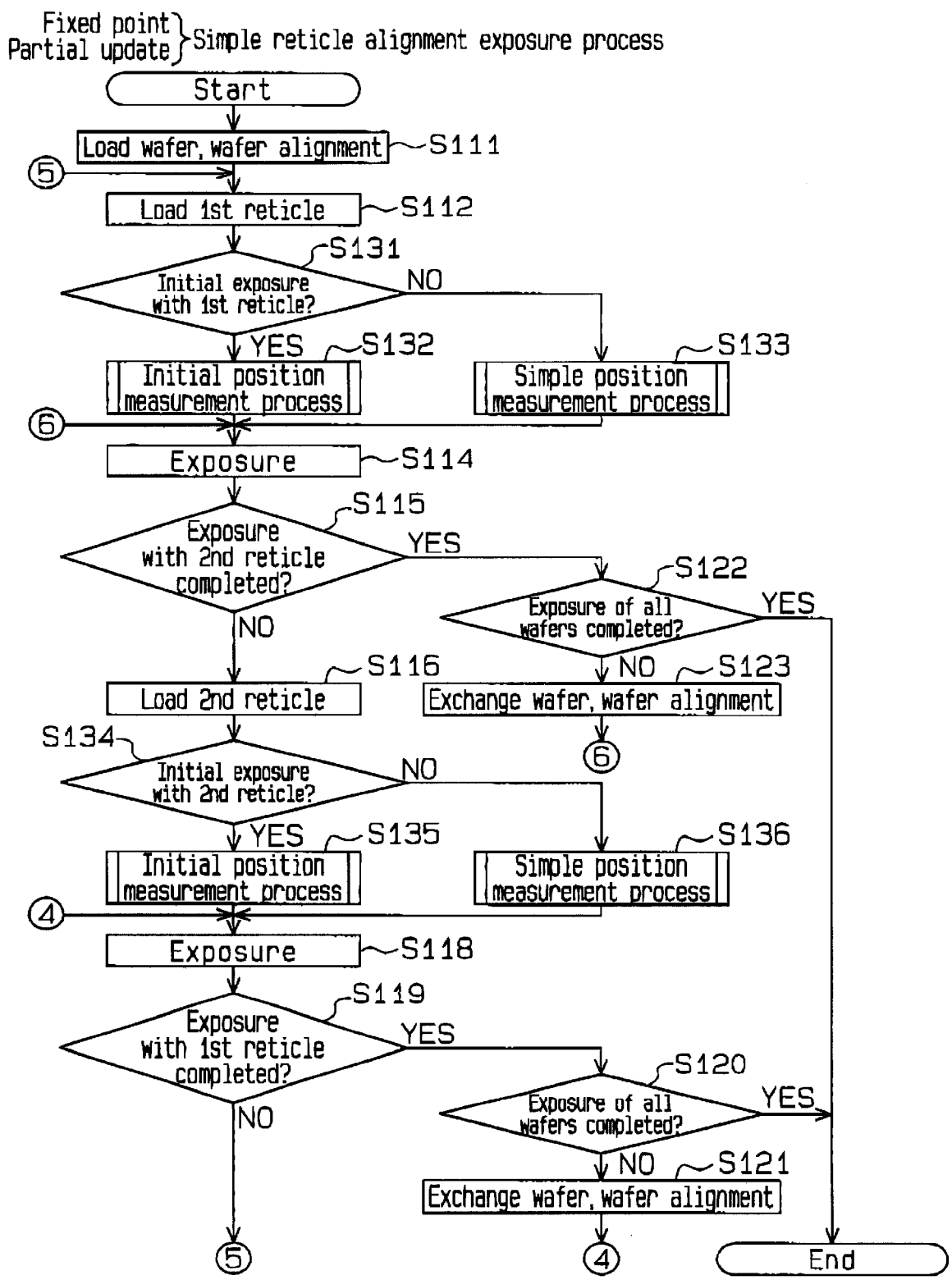
FIG. 15 is a flowchart illustrating common operations of fixed point reference simple exposure and partial update simple exposure.

The same sequences used in the fixed point reference simple exposure of step S105 and the partial update simple exposure of step S106 of FIG. 12 will now be described with reference to FIG. 15. In FIG. 15, the same processing as that of the fine exposure is denoted with the same step number and will not be described.

As shown in FIG. 15, during simple exposure, at step S112, if the first reticle R1 is placed on the reticle stage 21, it is determined whether exposure using the first reticle R1 is being performed for the first time within a predetermined time period, for example, in a single lot of the wafers W (S131). If it is determined that exposure is being performed for the first time, initial position measurement is performed by the RA microscopes 41, 42. Based on the measurement result, the first reticle R1 is positioned on the reticle stage 21 at its predetermined position (S132).

If it determined that the exposure with the first reticle R1 is being been performed for the second time or more in step S131, position measurement is performed in the fixed point reference simple mode or the partial update simple mode. Based on the measurement result, the first reticle R1 is positioned on the reticle stage 21 at the predetermined position (S133).

After the first reticle R1 is positioned, proceeding to step S114, the optical projection system 22 reduces and projects the circuit pattern of the first reticle R1 on each shot area Sn of the wafer W.

At step S116, if the second reticle R2 is placed on the reticle stage 21, it is determined whether exposure using the second reticle R2 is being performed for the first time in the predetermined period (S134). At step S134, if it is determined that exposure that uses the second reticle R1 is being performed for the first time, initial position measurement is performed. Based on the measurement result, the second reticle R2 is positioned at a predetermined position on the reticle stage 21 (S135).

At step S134, if it is determined that exposure with the second reticle is being been performed for the second time or after in step S134, position measurement in the fixed point reference simple mode or the partial update simple mode is performed. The second reticle R2 is positioned at the predetermined position on the second reticle stage 21 (S136). After positioning the second reticle R2, proceeding to step S118, the circuit pattern of the second reticle R2 is projected and reduced on each shot area Sn of the wafer W by the optical projection system 22.

Then, the initial position measurement of steps S132, S135, the position measurement in the fixed point reference simple mode of steps S133, S136, and the positioning of the reticles R1, R2 based on the measurement results will now be described with reference to FIG. 16.

Figure 16A:
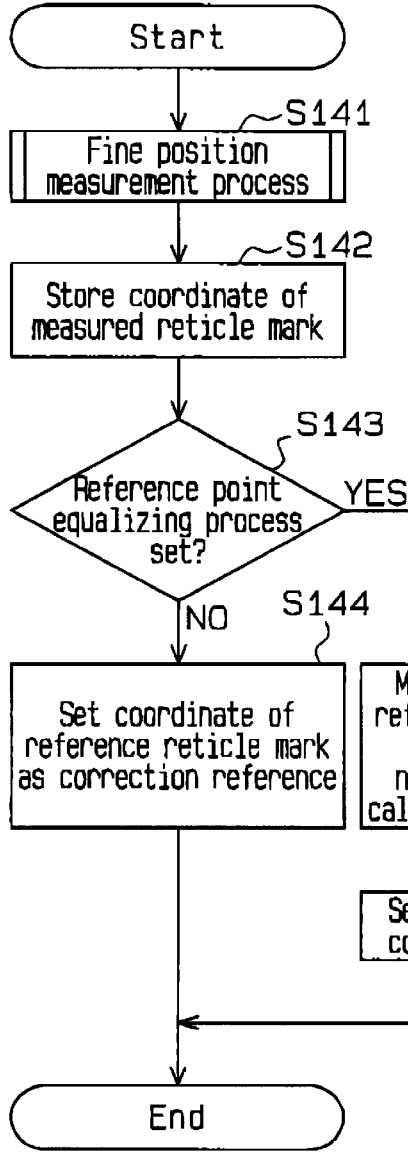
FIG. 16(a) is a flowchart illustrating initial position measurement in the fixed point reference simple exposure.

As shown in FIG. 16(a), during the initial position measurement, position measurement in the fine mode of FIG. 14 is performed and each of the reticles R1, R2 are positioned (S141). The measurement results of step S141, that is, the coordinate (Dpxn, Dpyn) of each reticle mark RMn is stored in the main control system 30 (S142). It is then determined whether the reference point equaling process is selected (S143). If it is determined that the average point equalizing process has not been set in step S143, the coordinate (Dpx1, Dpy1) related to the reference reticle mark RM1 is set as a correction reference (S144), and the initial position measurement is completed.

If it is determined that the reference point equalizing process has been set in step S143, the RA microscopes 41, 42 perform measurement of the reference reticle mark RM1 several more times. Then, the average value of the coordinate (Dpx1, Dpy1) of the obtained reference reticle mark RM1 is calculated (S145). The average value of the calculated coordinate (Dpx1, Dpy1) is set as the correction reference (S146), and the initial position measurement is completed.

Figure 16B:
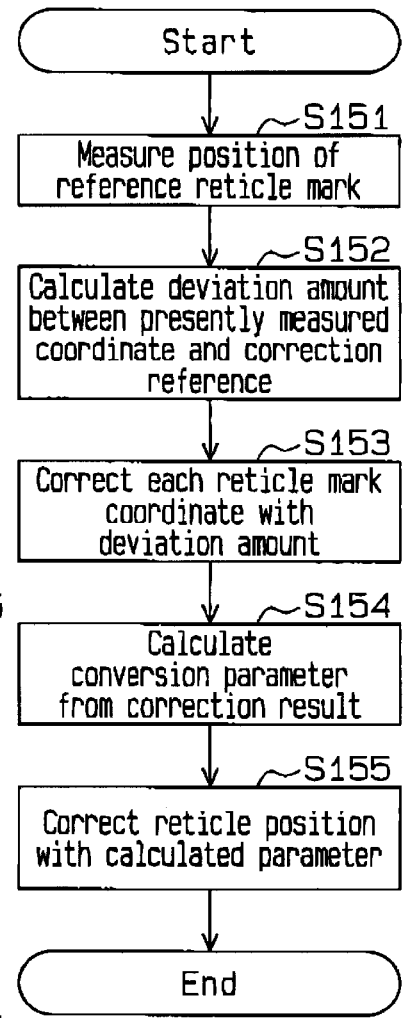
FIG. 16(b) is a flowchart illustrating position measurement in the fixed point reference simple exposure mode during the fixed point reference simple exposure.

As shown in FIG. 16(b), during position measurement in the fixed point reference mode, the position of the reference reticle mark RM1 on each reticle R1, R2 is measured by the RA microscopes 41, 42 (S151). Then, the deviation amount (ΔDx1, ΔDy1) between the coordinate (Dsx1, Dsy1) of the presently measured reference reticle mark RM1 (S151) and the correction reference coordinate (Dpx1, Dpy1) set in step S144 or step S146 of FIG. 16(a) is computed (S152).

The calculated deviation amount (ΔDx1, ΔDy1) is used to correct the coordinate (Dpxn, Dpyn) of each reticle mark RMn stored in step S142 is FIG. 16(a) (S153). The conversion parameters Rxs, Rys, θs, ωs, Oxs, Oys are calculated from the coordinate (Dsxn, Dsyn) of each corrected reticle mark RMn (S154). Then, the conversion parameters Rxs, Rys, θs, ωs, Oxs, Oys are used to convert the coordinate (Dsxn, Dsyn) to the positioning target coordinate (Fxn', Fyn') in the reticle stage coordinate system (x, y), that is, to the coordinate (X, Y) on the wafer stage 23. The positioning target coordinate (Fxn', Fyn') is used to adjust the fine drive amount of the reticle fine drive stage 26 and each reticle R1, R2 is positioned on the reticle stage 21 (S155). This completes the position measurement in the fixed point reference simple mode.

The initial position measurement in steps S132, S135 of FIG. 15 during the partial update simple exposure, the position measurement in steps S133, S136 of FIG. 16 during the partial update simple mode, and the positioning of each reticle R1, R2 based on these measurement results will now be described with reference to FIG. 17.

Figure 17A:
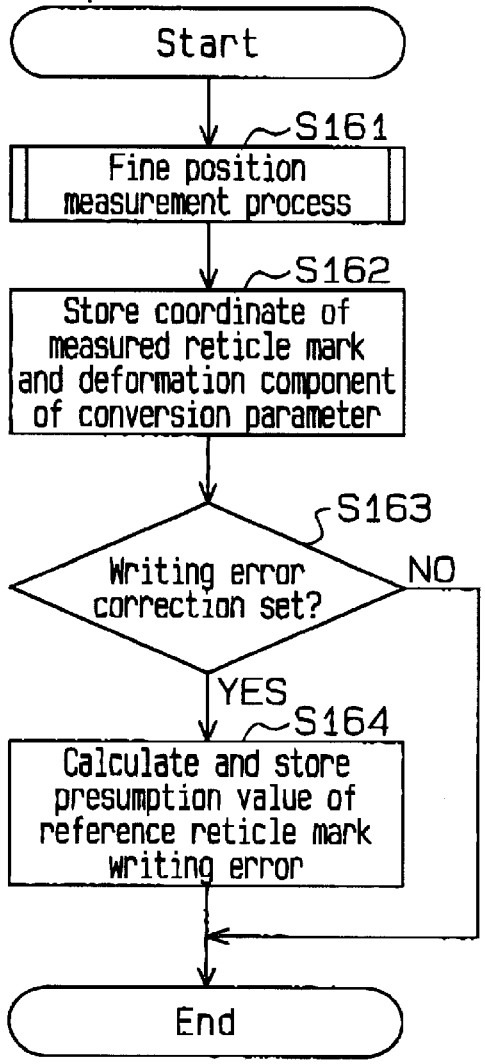
FIG. 17(a) is a flowchart illustrating initial position measurement during the partial update simple exposure.

As shown in FIG. 17(a), during initial measurement, position measurement in the fine mode of FIG. 14 is performed and the reticles R1, R2 are positioned (S161). The measurement result of step S161, or the coordinate (Dpxn, Dpyn) of each reticle mark RMn, is stored in the memory of the main control system 30. Further, the conversion parameters Rxp, Ryp, θp, ωp, Oxp, Oyp calculated from the coordinate (Dpxn, Dpyn) are stored in the main control system 30 (S162).

Next, it is determined whether the writing error correction process is set (S163). If it determined that the writing error correction process is set in step S163, the relative positions of the reference reticle marks RM1 and the reticle marks RM10 are obtained. The obtained relative positions are compared with the prestored, designed relative positions RM1, RM10 to obtain writing error presumption values of the reference reticle marks RM1, the presumption values are stored in the memory of the main control system 30 (S164), and the initial measurement is then completed.

In step S163, if it is determined that the writing error correction process in not set, step S164 is bypassed, and the initial position measurement is completed.

Figure 17B:
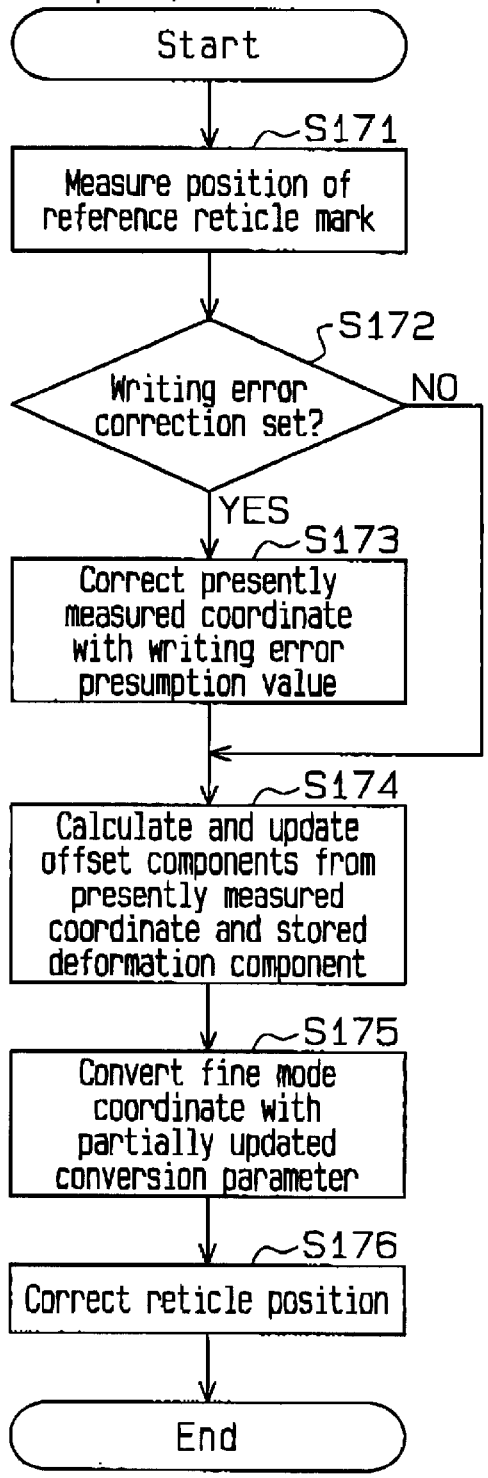
FIG. 17(b) is a flowchart illustrating position measurement in the partial update simple mode during the partial update simple exposure.

Further, as shown in FIG. 17(b), during position measurement in the partial update simple mode, the RA microscopes 41, 42 are used to measure the position of the reference reticle marks RM1 of each reticle R1, R2 (S171). Next, it is determined whether the writing error correction process is set (S172). If it is determined that the writing error correction process is set in step S172, the presumption value of the writing error stored in step S164 is used to correct the coordinate (Dsx1, Dsy1) of the presently measured reference reticle mark RM1 (S173). If it is determined that the writing error correction process is not set in step S172, step S173 is bypassed.

Next, the offset components Oxs, Oys, θs of the posture-related conversion parameters, such as the arrangement position and arrangement direction of the reticles R1, R2, are calculated from the presently measured coordinate (Dsx1, Dsy1) of the presently measured reference reticle marks RM1 and the deformation components Rxp, Ryp, ωp of the conversion parameters stored in step S162 of FIG. 17(a). Then, the offset component stored in the main control system 30 is updated (S174).

Then, the partially updated conversion parameters Rxp, Ryp, θs, ωp, Oxs, Oys are used to convert the coordinate (Dpxn, Dpyn), which is stored in the memory of the main control system 30, to the positioning target coordinate (Fxn', Fyn') in the reticle stage coordinate system (x, y) (S175). The target coordinate (Fxn', Fyn') is used to adjust the fine adjustment amount of the reticle fine drive stage 26 and the reticles R1, R2 are positioned on the reticle stage 21 (S176). This completes position measurement in the partial update simple mode.

The advantages described below are obtained in this embodiment.

(a) The exposure apparatus of this embodiment includes the RA microscopes 41, 42, which measure the relative position between the reticle mark RMn on the reticle R and the RA reference mark RSMn on the wafer stage 23, which are arranged at conjugated positions. In the exposure apparatus, fine mode position measurement, during which the relative position of all of the marks RMn, RSMn are measured, and fixed point reference and partial update simple mode, during which only a pair of both marks RM1, RSM1 are measured, may be set. If the reticle R subsequent to exchange is the same as one of the reticles R prior to the exchange, position measurement in any one of the simple modes is performed. Based on the measurement result, the position measurement result of the most recent fine mode subsequent to the exchange is corrected, and the position of the reticle R subsequent to the exchange is detected based on the corrected measurement result.

In other words, for example, during the exposure process of one lot of the wafers W, if the coordinate (Dpxn, Dpyn) of all of the reticle marks RMn subsequent to the exchange is measured, only the coordinate (Dsx1, Dsy1) of the reference reticle mark RM1 is measured. Based on the measurement result, the most recent coordinate (Dpxn, Dpyn) measured in the fine mode is corrected, and the position of the reticle prior to exchange is detected based on the corrected coordinate.

Therefore, the position measurement of all the reticle marks RMn is required to be performed, for example, only during exposure of the first wafer W. From the second exposure and thereafter, only the coordinate (Dsx1, Dsy1) of the reference reticle mark RM1 is required to be measured. Accordingly, the number of reticle marks RMn measured is decreased and the time required for reticle alignment is shortened.

In addition, the positioning of the reticle R subsequent to exchange is performed by correcting the most recent coordinate (Dpxn, Dpyn), which is measured in the fine mode, based on the position measurement result of the simple mode from the second exposure and afterward. Accordingly, the reticle alignment accuracy from the second exposure and afterward does not decrease. In this manner, the throughput is increased and high reticle alignment accuracy is maintained.

(b) The exposure apparatus of the present embodiment is capable of performing double exposure in which the circuit patterns of the first and second reticles R1, R2 are continuously overlapped on a single wafer W. During double exposure, the reticle must be exchanged once for each wafer W. This inevitably increases the number of times the reticle R is changed. However, the exposure apparatus of the present embodiment decreases the time required for reticle alignment and is therefore optimal for double exposure. In addition, decrease in reticle alignment accuracy during double exposure is suppressed. Thus, the decrease in throughput is suppressed to a minimal level, while a circuit pattern is formed by combining two reticle patterns at the same layer of the wafer W during double exposure.

(c) In the exposure apparatus of the present embodiment, each reticle mark RMn is formed by a pair of the mark patterns 75, and each RA reference mark RSMn is formed by a pair of the reference mark patterns 77. Thus, when measuring the coordinate (Dsn, Dyn) of each RA reference mark RSMn, a further amount of information may be obtained. This further improves the reticle alignment accuracy.

(d) In the exposure apparatus of the present embodiment, the RA microscopes 41, 42 measure the position deviation amount between each reticle mark RMn and the corresponding RA reference mark RSMn. The conversion parameter is used to convert the coordinate (Dxn, Dyn) of each reticle mark ($\xi$, $\nu$) to the coordinate (Fxn', Fyn') in the reticle stage coordinate (x, y), which is the positioning target. The conversion parameter includes the offset components Ox, Oy, $\theta$, which are related with the posture of the reticle R, and the deformation components Rx, Ry, $\omega$, which are determined by the form of the reticle R. The offset components Ox, Oy, $\theta$ are error factors related with the arrangement position and direction of the reticle R produced each time the reticle R is exchanged. The deformation components Rx, Ry, $\omega$ are related with expansion, compression, and distortion of the reticle R and are error factors that depend on the reticle R itself. In other words, the deformation components is not caused by the exchange of the reticle R. In this manner, the error factors caused when exchanging the reticle R and the error factors that are not caused when exchanging the reticle R are handled separately as required.

(e) The exposure apparatus of the present embodiment is provided with the fixed point reference simple mode to correct the measurement result of each reticle mark RMn, which is taken in the fine mode, based on the difference between the position measurement result of the reference reticle mark RM1 in the most recent fine mode and the position measurement result remeasured after exchanging the reticle R.

In the fixed point reference simple mode, the difference between the coordinate (Dpx1, Dpy1) of the reference reticle mark RM1 in the fine mode and the coordinate (Dsx1, Dsy1) remeasured after exchanging the reticle, that is, the deviation amount, is calculated. Presuming that the other reticle marks RMn are also deviated from the coordinate (Dpxn, Dpyn) in the fine mode, the coordinate (Dpxn, Dpyn) is corrected using the deviation amount.

When exchanging the reticle R, change in the posture of the reticle R is problematic. With regard to the posture change, there is practically no problem in presuming that each reticle mark RMn deviates in substantially the same manner. Further, the deviation amount obtained from the two position measurement results of the reference reticle mark RM1 is used to correct the coordinate of each reticle mark RMn. As a result, even if there is a writing error of the reference reticle mark RM1, that is, a slight difference between the ideal position and the actual position, the formation difference does not affect the correction of the coordinate (Dpxn, Dpyn) of each reticle mark RMn.

Accordingly, the deviation amount of the reference reticle mark RM1 is used to perform positioning of the reticle R subsequent to exchange quickly and accurately without measuring the positions of all of the reticle marks RMn.

(f) The exposure apparatus of the present embodiment is provided with the partial update simple mode to correct the measurement result of each reticle mark RMn taken in the fine mode using the position measurement result of the remeasured reference reticle mark RM1 subsequent to the exchange of the reticle R and the deformation component of the conversion parameter calculated from the position measurement of the most recent fine mode.

In the partial update simple mode, the coordinate (Dsx1, Dsy1) of the reference reticle mark RM1 is remeasured. Then, the offset components Oxs, Oys, $\theta$s of the conversion parameters are obtained from the coordinate (Dsx1, Dsy1) and the conversion parameters Rxp, Ryp, $\omega$p, which are calculated based on the position measurement in the most recent fine mode. The offset components Oxs, Oys, $\theta$s are updated to correct the coordinate (Dpxn, Dpyn) obtained during the most recent fine mode.

It is difficult to perfectly match the posture of the reticle R in relation with the offset components Oxs, Oys, $\theta$ each time the reticle R is exchanged. In comparison, deformation of the reticle R in relation with the deformation components Rx, Ry, $\omega$ is relatively easily prevented by maintaining substantially constant storing conditions and handling conditions of the reticle R. Therefore, during reticle alignment, which is performed when the reticle R is exchanged, the reticle R is positioned without remeasuring the positions of all of the reticle marks RMn by updating only the offset components Oxs, Oys, $\theta$s. Accordingly, the conversion parameters Rxp, Ryp, $\theta$s, $\omega$p, Oxs, Oys for reticle alignment are easily calculated, and the load applied to the main control system 30 is decreased.

(g) In the exposure apparatus of the present embodiment, during the fixed point reference simple mode, the reference reticle mark RM1 is measured a multiple number of times when performing the initial fine position measurement, and the reference point equalizing process is set to calculate the average value of the measurement results and obtain the position measurement correction reference. This improves the position measurement accuracy of the reference reticle mark RM1 in the fine mode, and further improves the position measurement accuracy in the fixed point reference simple mode. Accordingly, subsequent to exchange, the reticle R is positioned with further accuracy.

(h) In the exposure apparatus of the present embodiment, during the partial update simple mode, a presumption value of the writing error of each reticle mark RMn during the same position measurement as the fine mode is calculated, and the writing error correction process is set to use the presumption value to correct the coordinate (Dsx1, Dsy1) of the reference reticle mark RM1 remeasured after the exchange of reticles. Thus, if a writing error is included in the position measurement result of the reference reticle mark RM1 in the fine mode, the writing error is prevented from affecting position measurement of the reference reticle mark RM1 in the partial update simple mode. Accordingly, the position measurement accuracy in the partial update simple mode is improved, and the reticle R is positioned with further accuracy subsequent to exchange.

(i) In the exposure apparatus of the present embodiment, each reticle mark RMn on the reticle R is detected by the transmission light of the RA reference mark RSMn that passes through the optical projection system 22. Thus, the measured coordinate (Dxn, Dyn) of each reticle mark RMn reflects the inner state (optical characteristic) of the optical projection system 22. Accordingly, the coordinate (Dxn, Dyn) of each reticle mark RMn is detected under the same conditions as actual exposure.

(j) In the exposure apparatus of the present embodiment, the first pattern of the first reticle R1 is transferred and the second pattern of the second reticle R2, which is exchanged with the first reticle R1, is transferred and overlapped with the first pattern on each shot area Sn of a first wafer W in a single lot. Before exchanging the second reticle R2 with the first reticle R1, the second pattern of the second reticle R2 is transferred on the next wafer W. Then, the second reticle R2 is exchanged with the first reticle R1, and the first pattern is transferred on the next wafer W overlapped with the second pattern.

Upon completion of double exposure, in which the first pattern and the second pattern are overlapped on each wafer W, the reticles R1, R2 are not exchanged, and only the wafers W are exchanged. Afterward, the first pattern is transferred on the new wafer W, the reticle is exchanged and the second pattern is overlapped and transferred.

In this manner, when a plurality of wafers W undergo double exposure, the reticle is exchanged only once for each wafer W. Accordingly, the number of times the reticles R1, R2 are exchanged is minimized, and the number of times of mask alignment, which is performed whenever a reticle exchange takes place, is decreased. This improves the throughput of the exposure apparatus when performing double exposure.

(k) In the exposure apparatus of the present embodiment, the position information of all of the reticle marks RMn on the first reticle R1 that are obtained through the fine mode is used to transfer the first pattern of the first reticle R1 to the first wafer W of a lot. Afterward, when the first pattern is transferred on the next wafer W, the deviation amount of the reference reticle mark RM1 resulting from reticle exchange in the fixed point reference simple mode is measured to position the first reticle R1. The position information related with the reference reticle mark RM1, which is obtained when the first wafer W undergoes transcription, is used to measure the deviation amount. Thus, when the first wafer W undergoes transcription, in addition to measuring the position of all of the reticle marks RMn in the fine mode, further position measurement of the reference reticle mark RM1 is not necessary to obtain the correction reference when performing transcription on the next wafer W. Accordingly, the time required for reticle alignment when performing transcription on the first wafer W is decreased, which improves the throughput of the exposure apparatus.

(Modified Example)

The present embodiment may be modified as described below.

1) In the embodiment, circuit patterns of a plurality of reticles R are overlapped on the same shot areas Sn of a wafer W. In contrast, for example, in an exposure apparatus for a liquid crystal display device, a single substrate may undergo transcription by connecting a plurality of reticle patterns on a single substrate. For example, a first pattern of a first reticle may be transferred on a first shot area, a second pattern of a second reticle may be transferred on a second shot area, and the first pattern may be transferred again on a third shot area.

In such structure, the advantages (a), (c) to (i), and (k) of the embodiment are obtained. Furthermore, when the same pattern is retransferred on the single substrate, the number of marks measured during reticle alignment may be decreased. That is, like in the preferred embodiment, the time required for reticle alignment may be decreased not only when performing multiple exposure, during which plural circuit patterns are superimposed on a single shot area Sn in a layered manner, but also when a plurality of different patterns are arranged on a substrate along a plane. This structure is effective not only when using the same reticle at least twice during exposure of a single substrate but also when using plural reticles, once each, during exposure of a single substrate and using at least one of the plural reticles when performing exposure on another substrate.

2) In the preferred embodiment, plural patterns may be transferred on a single substrate by using a reticle R having multiple types of circuit patterns and shifting the pattern by changing the illumination position of the exposure light EL on the reticle R. In this case, the number of times the reticle R is exchanged is decreased and the throughput of the exposure apparatus is further improved.

If the order for transferring the first pattern and the second pattern on each shot area Sn of the wafer W is reversed, the transcription of the second pattern to the shot area Sn where the first pattern was finally transferred enables the exposure of the wafer W to be performed continuously. In other words, without driving each drive stage 32–34 of the wafer stage 23, transcription may be switched from the first pattern to the second pattern merely by changing the illumination position of the exposure light EL on the reticle R. In addition, as long as the reticle R has undergone reticle alignment, the reticle alignment does not have to be performed again when switching patterns. Accordingly, this significantly decreases the time required to switch patterns and further improves the throughput of the exposure apparatus.

3) In the preferred embodiment, during initial position measurement (S132, S135) in the fixed point position reference simple exposure (S105), only position measurement is performed in the fine mode (S141). In contrast, in addition to the position measurement in the fine mode (S141), the position of a further reference reticle mark RM1 relative to the RA reference mark RSM1 may be measured to obtain the correction reference of the position measurement in the fixed point reference simple mode.

Further, in the preferred embodiment, when performing the initial position measurement (S132, S135) during the partial update simple exposure (S106), the presumption of the writing error of the reference reticle mark RM1 is performed by using part (Dpx1, Dpy1), (Dpx10, Dpy10) of the results of the position measurement in the fine mode (S161). In contrast, in addition to the position measurement in the fine mode (S161), the positions of the RA reference marks RSM1, RSM10 of the respective reticle marks RM1, RM10 may also be performed to obtain the presumption value of the writing error. This structure also obtains the advantages (a) to (j) of the described embodiment.

The writing error correction process is set in the partial update simple mode. That is, the writing error is presumed from the position information obtained by detecting a plurality of the reticle marks RMn. However, instead of using the position information of the reticle mark RMn using the RA microscopes 41, 42, for example, an inspection apparatus independent from the exposure apparatus may be employed to obtain the writing error of the reticle R (i.e., the relative position of the reticle mark RMn relative to the reticle pattern or the relative distance between the relative marks RMn, or the like) is obtained, and the writing error information is stored in a memory of a host computer which controls the exposure apparatus or a plurality of fabrication apparatuses (including the exposure apparatus). When the partial update simple mode is selected, the writing error information stored in the memory is read, and the position information of the reticle mark RMn detected by the RA microscopes 41, 42 is corrected based on the writing error information. Further, some (θs, θxs, θys in the above embodiment) of the six conversion parameters may be updated based on the corrected position information.

Further, the position information of the reticle mark RMn may be corrected based on the writing error information not only in the partial update simple mode but also in the fine mode and the fixed point reference simple mode. In addition, in any one of the fine mode, the fixed point reference simple mode, and the partial update simple mode, the arrangement error information of the RA reference mark RSMn formed by the reference mark plate 38 (the relative position and the distance, or the like, of the RA reference mark RSMn) may be detected beforehand and only the arrangement error information or the position information of the reticle mark RMn together with the above writing error information may be corrected.

4) In the preferred embodiment, position measurement of only the reference reticle mark RMn1 is performed (S151, S171) when performing position measurement in the fixed point reference and partial update simple modes. However, other reticle marks RMn may be used as the reference reticle mark. Further, the number of reference reticle marks may be any number as long as it is less than the number of reticle marks RMn measured in the fine mode.

Further, during position measurement in the fine mode, the positions of all of the reticle marks RMn are measured (S126). However, the number of reticle marks RMn, which positions are measured, may be any number as long as it is greater than the number of reference reticle marks measured in the two simple modes. In this manner, the advantages (a) to (k) of the embodiment may be obtained.

In the above embodiment, six conversion parameters in formula (5) are obtained during reticle alignment. Thus, the number of reticle marks RMn that are to be measured during position measurement in the fine mode is at least three (although they do not exist along the same line). This is because the RA reference mark RSMn and the reticle mark RMn are each two dimensional marks. In the same manner, the number (minimum value) of the reticle marks RMn that are to be measured is determined in accordance with the conversion parameters that are to be updated.

The reticle mark RMn and the RA reference mark RSMn are not restricted to the forms shown respectively in FIG. 6(*b*) and FIG. 7(*b*) and may take any form. Of course, the reticle mark RMn and the RA reference mark RSMn do not have to be two dimensional marks and may be one dimensional marks. If the reticle mark RMn and the RA reference mark RSMn are each a one dimensional mark, the number of reticle marks RMn that are to undergo position measurement in the above fine mode is at least six.

Furthermore, in the above embodiment, six conversion parameters Rxp, Ryp, θp, ωp, Oxp, Oyp are calculated. However, the conversion parameters calculated for reticle alignment are not limited to four types or six parameters and may be set as required. For example, the type and number may be changed (increased and decreased) in accordance with the required alignment accuracy or the like. Alternatively, presuming that Rxp=Ryp (=Rp) is satisfied, four types and five conversion parameters (Rp, θp, ωp, Oxp, Oyp) may be obtained. Further, in the above embodiment, formula (5) is used to perform reticle alignment. However, reticle alignment may be performed in any manner.

Further, in the above partial update simple mode, some of the six conversion parameters, that is, the three conversion parameters θs, Oxs, Oys are updated. However, the type and numbers of the conversion parameters is not limited in this manner and may be any number as long as the number is less than the fine mode. For example, the conversion parameters related with the magnification error do not have to be obtained and divided into X components (Rxp) and Y components (Ryp), and presuming that Rxp=Ryp (=Rp) is satisfied, five conversion parameters (Rp, θp, ωp, Oxp, Oyp) may be updated.

5) In the preferred embodiment, double exposure is described. However, the present invention may be embodied in multiple exposure, in which the patterns of three or more reticles R are sequentially overlapped. Further, patterns may be exposed on each shot area Sn of the wafer W by selecting, as required, plural reticles R from the three or more reticles R.

6) In the preferred embodiment, when transferring the circuit patterns of plural reticles R, which exposure order is determined, on a single wafer W, the reticles R may be exchanged in accordance with the exposure order for each wafer W. In this case, the advantages (a) to (i) and (k) of the preferred embodiment are obtained.

7) In the preferred embodiment, a reticle is exchanged after transferring a first pattern on a wafer W, and a second pattern is transferred overlapping the latent image of the first pattern. Then, the wafer W is exchanged and the second pattern is transferred on the next wafer W. Afterward, the reticle is exchanged and the first pattern is transferred overlapping the latent image of the second pattern. Instead, for example, the reticle may be exchanged after transferring the first pattern on all of the wafers W of a single lot and the second pattern may be transferred overlapping the latent image of the first pattern sequentially from the final wafer in the lot. The wafers on which the first pattern has been transferred is once returned to a wafer cassette to adjust the exposure process cycle time. This significantly decreases the number of times for exchanging the reticles R1, R2, decreases the exposure process time per lot by a large amount, and improves throughput. The transcription of the first pattern does not have to be started from the final wafer in the lot and may be started from any wafer, such as from the first wafer or from the second wafer and after.

The wafers W of a single lot may be divided into plural groups, and reticles may be exchanged after transferring the first pattern on all of the patterns in one group. The second pattern may be transferred to the wafers W to which the first pattern is transferred in an overlapping manner. The second pattern may first be transferred to the next group of wafers W and the first pattern may be transferred after exchanging the reticle in an overlapping manner.

Further, at least one of the number or the types of the reticles may differ between groups. For example, in the first group, first and second patterns are transferred on the wafers W in an overlapped state, and in the second group, second and third patterns are transferred on the wafers W. It is preferred that the second pattern be transferred after the first pattern in the first group and the third pattern be transferred after the second pattern in the second group so that the reticle R is not exchanged between the first wafer W in the second group and the final wafer W in the first group. Further, if the type of reticle R differs between groups, the exposure order of each group may be determined so that the exposure processing time of each lot becomes minimum, that is, so that the number of times the reticle R is exchanged is minimum.

8) In the preferred and illustrated embodiment, during the fixed point reference simple exposure (S105), the writing error correction process (S164) may be performed in lieu of the reference point equalizing process (S145 to S146). In this manner, when performing the writing error correction process instead of the reference point equalizing process, the advantages (a) to (f) and (h) to (k) of the preferred and illustrated embodiment are obtained. When the writing error correction process is added to the reference point equalizing process, the advantages (a) to (k) of the preferred and illustrated embodiment are obtained and position measurement accuracy in the fixed point reference simple mode is further improved. After the reticle R is exchanged, positioning is performed with further accuracy.

9) In the above embodiment, the reticle R is exchanged after transferring the first pattern on the plural shot areas of a single wafer W and transcription of the second pattern is started from the shot area on which the first pattern was finally transferred. Instead, the second patterns may be transferred on the plural shot areas in the same transcription order as the first pattern. When transferring the first and second patterns on each shot area of the wafer W, the scanning direction (orientation) of the first pattern and the second pattern may be the same.

10) In the preferred and illustrated embodiment, the exposure order of each shot area Sn is reversed prior to and subsequent to the exchange of wafer W. However, the exposure order may be the same. This also obtains the advantages (a) to (k) of the preferred and illustrated embodiment.

11) In the preferred and illustrated embodiment, the exposure of each shot area Sn on the wafer W may be performed from shot areas proximal to the reference mark plate 38 to shot areas separated from the reference mark plate 38 and then back to the proximal shot areas. In this case, the moved distance of the wafer Y axis drive stage 32 and the wafer X axis drive stage 33 of the wafer stage 23 may be decreased during reticle alignment performed when the reticle R is exchanged. Accordingly, in addition to advantages (a) to (k) of the preferred and illustrated embodiment, the time required for reticle alignment is decreased and the throughput of the exposure apparatus is further improved.

12) In the preferred and illustrated embodiment, during the fixed point reference simple exposure (S105) and the partial update simple exposure (S106), position measurement in the final mode (S141, S161) is performed only when each reticle R exposes the wafer W of a lot for the first time. In contrast, for example, the position measurement in the fine mode may be performed once every day or week when each reticle undergoes exposure for the first time. Alternatively, the position measurement in the fine mode may be performed for each lot, each day, or each week not only once during the initial exposure but repetitively for every predetermined interval to update the coordinate (Dpxn, Dpyn) of each reticle mark RMn. In this case, the number of position measurements performed in the fine mode increases slightly. However, exposure is performed while confirming chronological changes in the state of the exposure apparatus, and allows for quick response when an abnormality occurs.

13) In the preferred and illustrated embodiment, the illumination light IL may be relayed by a lens system in lieu of the optical fiber 51 and guided to the bottom surface of the reference mark plate 38. This also obtains the advantages (a) to (k) of the preferred and illustrated embodiment.

14) In the preferred and illustrated embodiment, the RA reference mark RSMn on the reference mark plate 38 of the Zθ axis drive stage may be illuminated from below, and the RA reference mark RSMn and the reticle mark RMn may simultaneously be observed by the RA microscopes 41, 42. In contrast, for example, the transmission light from the RA reference mark RSMn may be reflected above the reticle mark RMn and the image formed by the reflected light may be observed by providing the RA microscopes beside the wafer stage 23.

For example, the reticle mark RMn may be illuminated from the opposite side of the wafer stage 23 to project the reticle mark RMn on the RA reference mark RSMn of the wafer stage 23, and the image formed by the transmission light or the reflected light from the RA reference mark RSMn may be observed by the RA microscopes. In this case, the advantages (a) to (h) and (j) to (k) of the preferred and illustrated embodiment are obtained. Further, the position of each reticle mark RMn is measured by the optical projection system 22. The information related with the measured position reflects the inner state (optical characteristic), or the like, of the optical projection system 22. Accordingly, the position of each reticle mark RMn is detected under the same conditions as actual exposure.

In the above embodiment, in any one of the fine mode, the fixed point reference simple mode, and the partial update simple mode, the reticle fine drive stage 26 is driven to substantially match the coordinate (Fxn, Fyn) of the reticle mark RMn with the target coordinate (Fxn', Fyn'). However, the reticle fine drive stage 26 does not have to be moved to position the reticle R on the reticle stage 21. For example, the movement of the reticle stage 21 may be controlled by storing the difference between the coordinate (Fxn, Fyn) of the reticle mark RMn and the target coordinate (Fxn', Fyn') in a memory and adding the difference to the target position of the reticle R during scanning exposure.

In the above embodiment, wafer alignment, that is, positioning of the wafer W on the wafer stage 23, is performed in steps S121, S123, etc. An example of the preferred wafer alignment is enhanced global alignment (EGA), which is disclosed in, for example, Japanese Laid-Open Patent Application No. 61-44429 and its corresponding U.S. Pat. No. 4,780,617. In EGA, at least three, for example, about five to ten shot areas are selected as the alignment shot area, and the WA device 43 detects the wafer alignment mark of each alignment shot area to obtain the position information (the coordinate value in the perpendicular coordinate system XY). The measured position information in each alignment shot area and the corresponding designed position information are used to calculate a variable (parameter) of a model function that represents the shot area arrangement on the wafer W. Then, the position information (coordinate value) of each shot area is determined based on the model function, from which the parameter is calculated, and the designed position information of each shot area on the wafer W.

In synchronism with the movement of the reticle stage 21, the wafer stage 23 is moved in accordance with the determined position information and the base line amount of the WA device 43 so that the reticle R and the wafer W are moved simultaneously during scanning exposure. Accordingly, all of the shot areas on the wafer W undergo scanning exposure using the step and scan technique.

At practically the same time as the detection of the reticle mark RMn and the RA reference mark RSMn, the WA reference marks WSM on the reference mark plate 38 are detected by the WA device 43. It is preferred that the base line amount of the WA device 43 be calculated based on the detection result of the RA microscopes 41, 42 and the detection result of the WA device 43. This enables reticle alignment and base line measurement to be performed at the same time and improves the throughput of the exposure apparatus. Such base line measurement operation is disclosed in, for example, Japanese Laid-open Patent Application No. 4-324923 and its corresponding U.S. Pat. No. 5,243,195 and the disclosure of the publication and U.S. patent are hereby incorporated by reference. It is preferred that the arrangement error of the RA reference mark WSM (the relative position and interval, or the like, of the grid point WSMn) be detected beforehand, and the base line amount be determined in accordance with the arrangement error.

15) In the embodiment, the present invention is embodied in a step and scan reducing projection exposure apparatus. Furthermore, the present invention may be embodied in a step and repeat stepper, a mirror projection aligner, a proximity aligner, a contact aligner, a step and stitch exposure apparatus, a photo repeater, and the like. In the step and stitch technique, any one of stationary exposure and scanning exposure is performed when transferring a pattern to each shot area.

In the exposure apparatus of FIG. 1, the optical projection system 22 is a reducing magnification system. However, the optical system 22 may be an equal magnification system or an enlarging magnification system. Further, the optical projection system 22 may be one of a deflection system formed only from plural deflection elements, a reflection system formed only from plural reflection elements, and a reflection-deflection system formed from deflection elements and reflection elements.

In addition to an exposure apparatus for fabricating semiconductor devices, the present invention may be embodied in exposure apparatuses, or the like, used to fabricate, for example, display devices, such as liquid crystal display devices and plasma displays, thin film magnetic heads, and imaging devices (CCD). Further, the present invention may be embodied in, for example, a step and stitch exposure apparatus used to fabricate the reticle or mask used in the above microdevice fabrication exposure apparatus. In the exposure apparatus used for fabrication of the reticle or mask, a parent pattern, which is obtained by dividing an enlarged pattern of the pattern that is to be formed on the mask into multiple parts, is transferred through the step and stitch technique on an original plate of the reticle or mask.

Further, in the embodiment, an excimer laser is used as a light source of the exposure light. However, for example, ultraviolet light, such as g ray, h ray, and i ray, far ultraviolet light, vacuum ultraviolet light, X ray, electronic rays, and the like may be used as the exposure light EL. Further, higher harmonics, such as metal vapor laser and YAG laser, may be used as the exposure light.

High harmonics obtained by amplifying a single wavelength laser in the infrared band or visible band that is emitted from a DFB semiconductor laser or fiber laser with a fiber amp doped with, for example, erbium (or both erbium and ytterbium), and converting the wavelength to ultraviolet light using a non-linear optical crystal. More specifically, if the oscillation wavelength of a single wavelength laser is in the range of 1.51 to 1.59 $\mu$m, an 8× high harmonic, which generated wavelength is in the range of 189 to 199 nm, or a 10× high harmonic, which generated wavelength is in the range of 151 to 159 nm, are output. Especially, if the oscillation wavelength is in the range of 1.544 to 1.553 $\mu$m, and 8× high harmonic in the range of 193 to 194 nm, that is, ultraviolet light having substantially the same wavelength as an ArF excimer laser, is obtained, and if the oscillation wavelength is in the range of 1.57 to 1.58 $\mu$m, a 10× high harmonic in the range of 157 to 158 nm, that is, ultraviolet light having substantially the same wavelength as an $F_2$ laser, is obtained. If the oscillation wavelength is in the range of 1.03 to 1.12 $\mu$m, a 7× high harmonic, which generated wavelength is in the range of 147 to 160 nm is output, and if the oscillation wavelength is in the range of 1.099 to 1.106 $\mu$m, a 7× high harmonic in the range of 157 to 158 nm, that is, ultraviolet light having substantially the same wavelength as an $F_2$ laser, is obtained. An ytterbium dope fiber laser, or the like, is used as the single wave oscillation laser.

An EUV (Extreme Ultra Violet) light, which has a wavelength of, for example, 13.4 nm or 11.5 nm, of a laser plasma light source or of a soft X ray band (wavelength 5 to 15 nm) generated from an SOR may be used. In an EUV exposure apparatus, a reflective reticle (mask) is used, the optical projection system is a reducing system in which only the image side is telecentric, and the reflection system only includes plural (three to six) reflective optical elements.

An optical projection system, which is formed by a plurality of optical elements incorporated in a mirror barrel, and at least part of an optical illumination system formed by a plurality of optical devices (including an optical integrator, or the like) are fixed to a base, which is supported by a plurality of damping pads, optical adjustment of the optical illumination system and the optical projection system is performed, and wires and pipes are connected to the reticle stage and the wafer stage, which are formed by a large number of mechanical components. Furthermore, the reference mark plate 38 is arranged on a wafer stage (the Z$\theta$ axis drive stage 34), the RA microscopes 41, 42 and the WA device are each fixed to the base and connected to the main control system 30, and total adjustment (electrical adjustment, operation check, etc.) are performed to manufacture the projection exposure apparatus of FIG. 1. It is preferred that the exposure apparatus be manufactured in a clean room, in which temperature, cleanness, etc. are managed.

Semiconductor devices are fabricated by designing the function and capability of the device, producing a reticle based on the designed function, producing a wafer from silicon material, transferring the pattern of the reticle on the wafer with the exposure apparatus of FIG. 1, assembling (dicing, bonding, and packaging) the device, and inspecting the device.

Finally, in a known exposure method, a mask having plural types of patterns is used, and the illumination position of an exposure light on the mask is changed to selectively transfer various patterns on a substrate. In this exposure method, when the transcription of the first pattern on the substrate is completed and transcription is switched to the second pattern, the exposure method described above is used to start transcription of the second pattern on the divided (shot) area, at which the first pattern was finally transferred. In other words, transcription may be switched from the first pattern to the second pattern without changing the illumination position of the exposure light relative to the mask. Accordingly, the time required for switching patterns is shortened and the throughput of the exposure apparatus is further improved.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalents of the appended claims.

What is claimed is:

1. An exposure apparatus for transferring a pattern formed on a plurality of masks onto at least one substrate, wherein the masks are exchanged within a predetermined time period, the exposure apparatus comprising:
    a position sensor that measures relative position information of a plurality of reference marks arranged in correspondence with a plurality of measurement marks on the marks; and
    a measurement controller, connected to the position sensor, that controls the position sensor with a first position measurement mode that measures plural pieces of first relative position information of the measurement marks and the reference marks and a second position measurement mode that measures second relative position information, the number of which is less than the first relative position information measured by the first position measurement mode,
    wherein, when the mask subsequent to an exchange matches the mask prior to the exchange during the predetermined time period, the second relative position information is measured by the second position measurement mode, the first relative position information associated with the mask subsequent to exchange is corrected using the second relative position information, and position information of the mask subsequent to the exchange is detected based on the corrected first relative position information.

2. The exposure apparatus according to claim 1, further comprising a multiple exposure mechanism for continuously transferring the patterns of the plurality of the masks onto the substrate.

3. The exposure apparatus according to claim 1, wherein the first position measurement mode includes measuring the first relative position information of plural first sets of the measurement marks and the reference marks, and the second position information measurement mode includes measuring the second relative information of second sets of the measurement marks and the reference marks, the number of second sets being less than the number of first sets.

4. The exposure apparatus according to claim 1, wherein the position sensor measures a position deviation of each of the measurement marks relative to the corresponding reference marks, and in accordance with the measured position deviation, calculates an offset component, which includes a parameter for offsetting in a direction of two axes perpendicular to a mask coordinate system on the mask and a parameter for rotating about an axis perpendicular to the two axes, and a deformation component, which includes a parameter of magnification of the measurement marks and the reference marks and a parameter of perpendicularity of the two axes of the mask coordinate system.

5. The exposure apparatus according to claim 1, wherein, based on a difference between the second relative position information measured by the second position measurement mode and the most recent first relative position information of each measurement mark measured by the first position measurement mode, the position sensor corrects the most recent first relative information position of the other measurement marks measured by the first position measurement mode.

6. The exposure apparatus according to claim 4, wherein, when correcting the most recent first relative position information measured by the first position measurement mode using the second relative position information measured by the second position measurement mode, the position sensor uses each of the parameters calculated based on the most recent first relative position information of the first position measurement mode for the deformation components and calculates each of the parameters based on the second relative position information of the second position measurement mode for the offset components.

7. The exposure apparatus according to claim 1, wherein the first position measurement mode includes measuring the first relative position information a multiple number of times and generating an average value of the first relative position information for the measurement marks measured by the second position measurement mode.

8. The exposure apparatus according to claim 1, wherein the first position measurement mode includes presuming an absolute formation position error of the measurement marks measured by the second position measurement mode and correcting the second relative position information measured by the second position measurement mode based on the presumption error.

9. An exposure method for transferring a pattern formed on a plurality of masks onto a substrate, wherein the masks are exchanged within a predetermined time period, the exposure method comprising the steps of:
    measuring first relative position information of a plurality of measurement marks arranged on the mask and a plurality of reference marks arranged in correspondence with the plurality of measurement marks;
    exchanging the masks for a plurality of times;
    measuring second relative position information of the measurement marks and the reference marks, the number of which is less than the first relative position information, when the mask subsequent to an exchange matches one of the masks prior to the exchange during the predetermined time period;
    correcting the relative first position information related with the mask subsequent to the exchange using the second relative position information; and
    detecting the position of the mask subsequent to the exchange based on the corrected first relative position information.

10. A method for manufacturing a semiconductor device comprising the steps of transferring a device pattern on a work piece using the exposure method according to claim 9.

11. An exposure method for transferring a pattern onto at least one substrate using a plurality of masks, which includes a first mask and a second mask respectively having a first pattern and a second pattern, in the same exposure apparatus, the exposure method comprising the steps of:
    generating a plurality of pieces of first position information by detecting a plurality of marks formed on the first mask;
    transferring the first pattern of the first mask onto a first substrate using the plurality of pieces of first position information;
    exchanging the first mask with the second mask;
    transferring the second pattern of the second mask onto the first substrate or a second, different substrate;

exchanging the second mask with the first mask;
generating second position information by detecting some of the plurality of marks formed on the first mask; and
transferring the first pattern onto the first and second substrates and onto a third substrate, which differs from the first and second substrates, using the second position information and at least one piece of the first position information.

12. The exposure method according to claim 11, wherein the plurality of marks on the first mask are detected by an optical projection system of the exposure apparatus, the exposure method further comprising the step of detecting at least one piece of information related with the position, rotation, magnification, and distortion of a pattern image projected by the optical projection system using the second position information and at least one piece of the first position information to transfer the first pattern to the first, second, and third substrates.

13. A method for manufacturing a semiconductor device comprising the steps of transferring a device pattern on a work piece using the exposure method according to claim 11.

14. An exposure method for transferring at least two patterns in an overlapped manner onto a plurality of substrates including a first substrate and a second substrate using a plurality of masks including a first mask and a second mask, which respectively have a first pattern and a second pattern, in the same exposure apparatus, the exposure method comprising the steps of:
    generating a plurality of pieces of position information by detecting a plurality of marks formed on the first mask;
    transferring the first pattern of the first mask onto the first substrate, wherein the plurality of pieces of position information is used in the step of transferring the first pattern onto the first substrate;
    exchanging the first mask with the second mask;
    transferring the second pattern of the second mask onto the first substrate in a manner overlapping the first pattern;
    exchanging the first substrate with the second substrate;
    transferring the second pattern of the second mask onto the second substrate;
    exchanging the second mask with the first mask; and
    transferring the first pattern of the first mask onto the second substrate in a manner overlapping the second pattern, wherein some of the plurality of position information are used in the step of transferring the first pattern onto the second substrate.

15. A method for manufacturing a semiconductor device comprising the steps of transferring a device pattern on a work piece using the exposure method according to claim 14.

16. An exposure apparatus for transferring a pattern onto at least one substrate using a plurality of masks including a first mask and a second mask respectively having a first pattern and a second pattern, the exposure apparatus comprising:
    a mask stage on which the first or second mask is arranged;
    a substrate stage on which a substrate is arranged;
    an exposure mechanism for exposing the first or second pattern on the substrate;
    a detection unit for detecting a plurality of marks formed on the first mask; and
    a control unit for generating a plurality of pieces of first position information based on the detected plurality of marks and controlling the mask stage, the substrate stage, and the exposure mechanism using the plurality of pieces of the first position information to transfer the first pattern of the first mask onto the first substrate, wherein, when the first mask is exchanged with the second mask, the control unit controls the mask stage, the substrate stage, and the exposure mechanism to transfer the second pattern of the second mask onto the first substrate or onto a second, different substrate, and when the second mask is re-exchanged with the first mask, the detection unit detects only some of the plurality of marks formed on the first mask to generate second position information, and the control unit controls the mask stage, the substrate stage, and the exposure mechanism using the second position information and at least one piece of the first position information to transfer the first pattern onto the first and second substrates and onto a third substrate differing from the first and second substrates.

17. An exposure apparatus for transferring at least two patterns in an overlapping manner onto a plurality of substrates including first and second substrates using a plurality of masks including a first mask and a second mask, which respectively have a first pattern and a second pattern, the exposure apparatus comprising:
    a mask stage on which the first or second mask is arranged;
    a substrate stage on which the first or second substrate is arranged;
    an exposure mechanism for exposing the first or second pattern on the first or second substrate;
    a control unit for controlling the mask stage, the substrate stage, and the exposure mechanism, transferring the first pattern of the first mask onto the first substrate, transferring the second pattern of the second mask onto the first substrate in a manner overlapping the first pattern after exchanging the first mask with the second mask, transferring the second pattern of the second mask onto the second substrate after the first substrate is exchanged with the second substrate, and transferring the first pattern of the first mask onto the second substrate in an manner overlapping the second pattern after the second mask is exchanged with the first mask; and
    a detection unit for detecting a plurality of marks formed on the first mask, wherein the control unit generates a plurality of pieces of position information using the detected plurality of marks, controls transfer of the first pattern onto the first substrate using the plurality of pieces of position information, and controls transfer of the first pattern onto the second substrate using some of the plurality of pieces of position information.

18. An exposure method for sequentially exposing a plurality of mask patterns on a first substrate and then exchanging the first substrate with a second substrate to sequentially expose the plurality of mask patterns on the second substrate, the exposure method comprising the steps of:
    using the mask used during a final exposure of the first substrate for a first exposure of the second substrate;
    measuring plural pieces of first position information by detecting a plurality of marks formed on a first mask of the plurality of masks when exposing the first substrate using the first mask; and
    measuring second position information, the number of which is less than the plural pieces of first position information, when the first mask is used to expose the second substrate.

19. The exposure method according to claim 18, further comprising the step of:

after the second substrate undergoes exposure and when sequentially exposing a third substrate, which differs from the first and second substrates, with the plurality of mask patterns, using the mask used during the final exposure of the second substrate for the initial exposure of the third substrate.

20. A method for manufacturing a semiconductor device comprising the steps of transferring a device pattern on a work piece using the exposure method according to claim 18.

21. An exposure apparatus for sequentially exposing a plurality of mask patterns onto a plurality of substrates, the exposure apparatus comprising:

a projection system for projecting the mask patterns onto the substrates;

an exposure controller for sequentially exposing the plurality of mask patterns on a first substrate of the plurality of substrates, then exchanging the first substrate with a differing second substrate, and using the mask used during the final exposure of the first substrate for the initial exposure of the second substrate; and a measurement controller for measuring plural pieces of first position information by detecting a plurality of marks formed on a first mask of the plurality of masks when exposing the first substrate using the first mask and for measuring second position information, the number of which is less than the plural pieces of first position information, when the first mask is used to expose the second substrate.

* * * * *